(12) United States Patent
Rashidi et al.

(10) Patent No.: US 11,990,911 B2
(45) Date of Patent: May 21, 2024

(54) CLOCK DRIVER FOR TIME-INTERLEAVED DIGITAL-TO-ANALOG CONVERTER

(71) Applicant: QUALCOMM Incorporated, San Diego, CA (US)

(72) Inventors: Negar Rashidi, Mission Viejo, CA (US); Nitz Saputra, Burlingame, CA (US); Ashok Swaminathan, Cardiff, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 252 days.

(21) Appl. No.: 17/654,916

(22) Filed: Mar. 15, 2022

(65) Prior Publication Data

US 2023/0299757 A1 Sep. 21, 2023

(51) Int. Cl.
| | |
|---|---|
| *H03K 5/05* | (2006.01) |
| *G06F 1/08* | (2006.01) |
| *H03K 5/156* | (2006.01) |
| *H03M 1/06* | (2006.01) |
| *H03M 1/08* | (2006.01) |
| *H03M 1/12* | (2006.01) |
| *H03M 1/82* | (2006.01) |

(52) U.S. Cl.
CPC ............... *H03K 5/05* (2013.01); *G06F 1/08* (2013.01); *H03K 5/156* (2013.01); *H03M 1/0624* (2013.01); *H03M 1/0836* (2013.01); *H03M 1/1215* (2013.01); *H03M 1/82* (2013.01)

(58) Field of Classification Search
CPC ........... H03K 5/05; H03K 5/156; H03M 1/82; H03M 1/0624; H03M 1/0836; H03M 1/1215; G06F 1/08

USPC .......................................................... 341/152
See application file for complete search history.

(56) References Cited

U.S. PATENT DOCUMENTS

| | | |
|---|---|---|
| 7,187,310 B2 | 3/2007 | El-Sankary et al. |
| 7,312,737 B2 | 12/2007 | Jungerman et al. |
| 7,561,095 B2 | 7/2009 | Sasaki et al. |
| 7,941,686 B2 | 5/2011 | Fujisawa et al. |
| 8,217,824 B2 | 7/2012 | Hernes et al. |
| 8,497,790 B1 | 7/2013 | Lewis et al. |
| 8,773,296 B1 | 7/2014 | Dusatko et al. |
| 9,007,250 B1 | 4/2015 | Jeraj et al. |

(Continued)

OTHER PUBLICATIONS

Partial International Search Report—PCT/US2023/063504—ISA/EPO—dated Jun. 21, 2023.

(Continued)

*Primary Examiner* — Khai M Nguyen
(74) *Attorney, Agent, or Firm* — Loza & Loza, LLP

(57) ABSTRACT

In certain aspects, a method for providing a first drive clock signal and a second drive clock signal to a first sub-digital-to-analog converter (sub-DAC) and a second sub-DAC includes receiving an input clock signal, and dividing the input clock signal to generate a first divided clock signal and a second divided clock signal. The method also includes gating the input clock signal using the first divided clock signal to generate the first drive clock signal, and inputting the first drive clock signal to a clock input of the first sub-DAC. The method further includes gating the input clock signal using the second divided clock signal to generate the second drive clock signal, and inputting the second drive clock signal to a clock input of the second sub-DAC.

32 Claims, 20 Drawing Sheets

(56) References Cited

U.S. PATENT DOCUMENTS

| | | |
|---|---|---|
| 9,088,298 B2 | 7/2015 | Wloczysiak |
| 9,178,528 B1 | 11/2015 | Waltari |
| 9,300,307 B2 | 3/2016 | Juneau et al. |
| 9,537,514 B2 | 1/2017 | Talty et al. |
| 9,621,183 B2 | 4/2017 | Baringer et al. |
| 9,871,504 B2 | 1/2018 | Clara et al. |
| 9,973,203 B1 | 5/2018 | Azenkot et al. |
| 10,056,891 B1 * | 8/2018 | Stuenkel ............ H03K 5/1565 |
| 10,305,522 B1 | 5/2019 | Asuri et al. |
| 10,516,412 B1 | 12/2019 | Mehdizad et al. |
| 11,184,018 B1 | 11/2021 | Liu et al. |
| 2003/0151441 A1 | 8/2003 | Neff |
| 2008/0198053 A1 | 8/2008 | Tsang |

OTHER PUBLICATIONS

Zahrai S A., et al., "Design of Clock Generation Circuitry for High-speed Subranging Time-interleaved ADCs", 2017 IEEE International Symposium on Circuits and Systems (ISCAS), IEEE, May 28, 2017, 4 Pages, XP033156514, Section III.B, figure 4.

Maxim: "Synchronizing Multiple High-Speed Multiplexed DACs for Transmit Applications", Sep. 21, 2006 (Sep. 21, 2006 ), pp. 1-6, XP002492319, Retrieved from the Internet: URL: http://www.maxim.ic.com/an3901. [retrieved on Aug. 14, 2008].

McCue J.J., et al., "A Time-Interleaved Multimode ΔΣ RF-DAC for Direct Digital-to-RF Synthesis", IEEE Journal of Solid-State Circuits, May 2016, vol. 51, No. 5, pp. 1109-1124.

International Search Report and Written Opinion—PCT/US2023/063504—ISA/EPO—dated Sep. 8, 2023.

\* cited by examiner

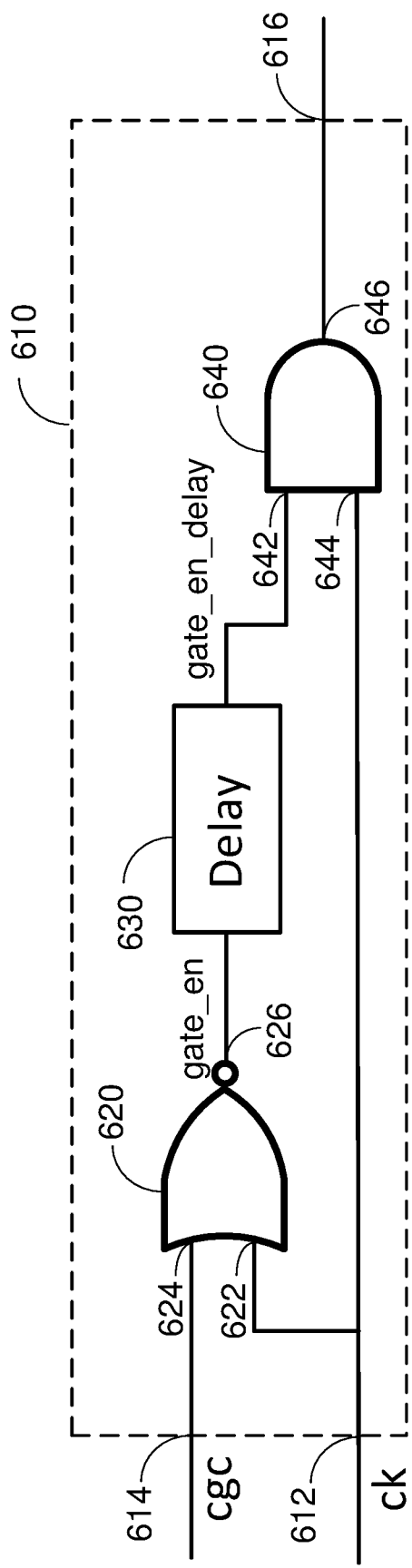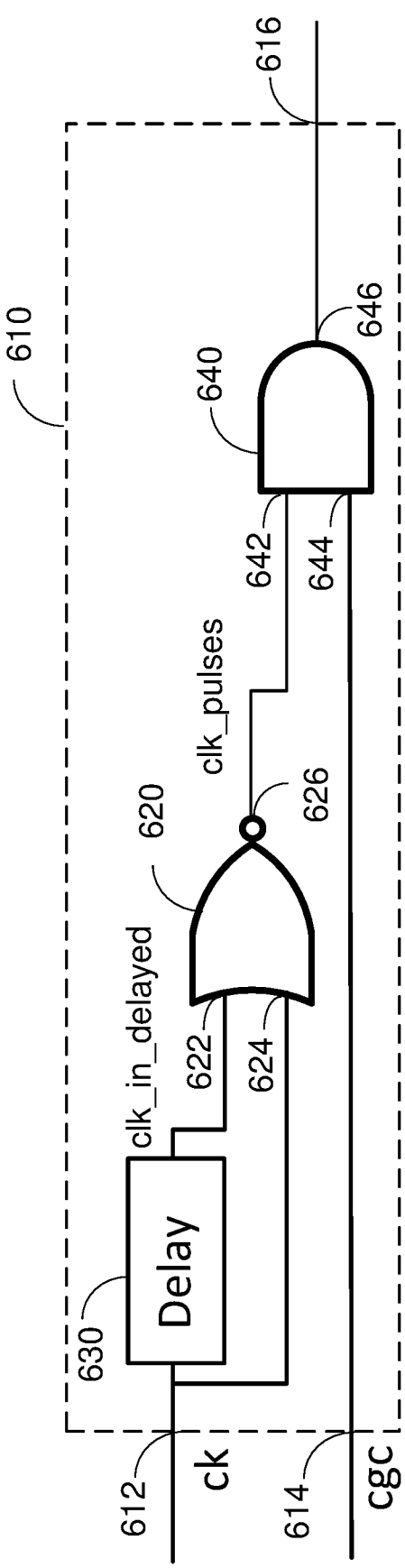
FIG. 6A
FIG. 6B

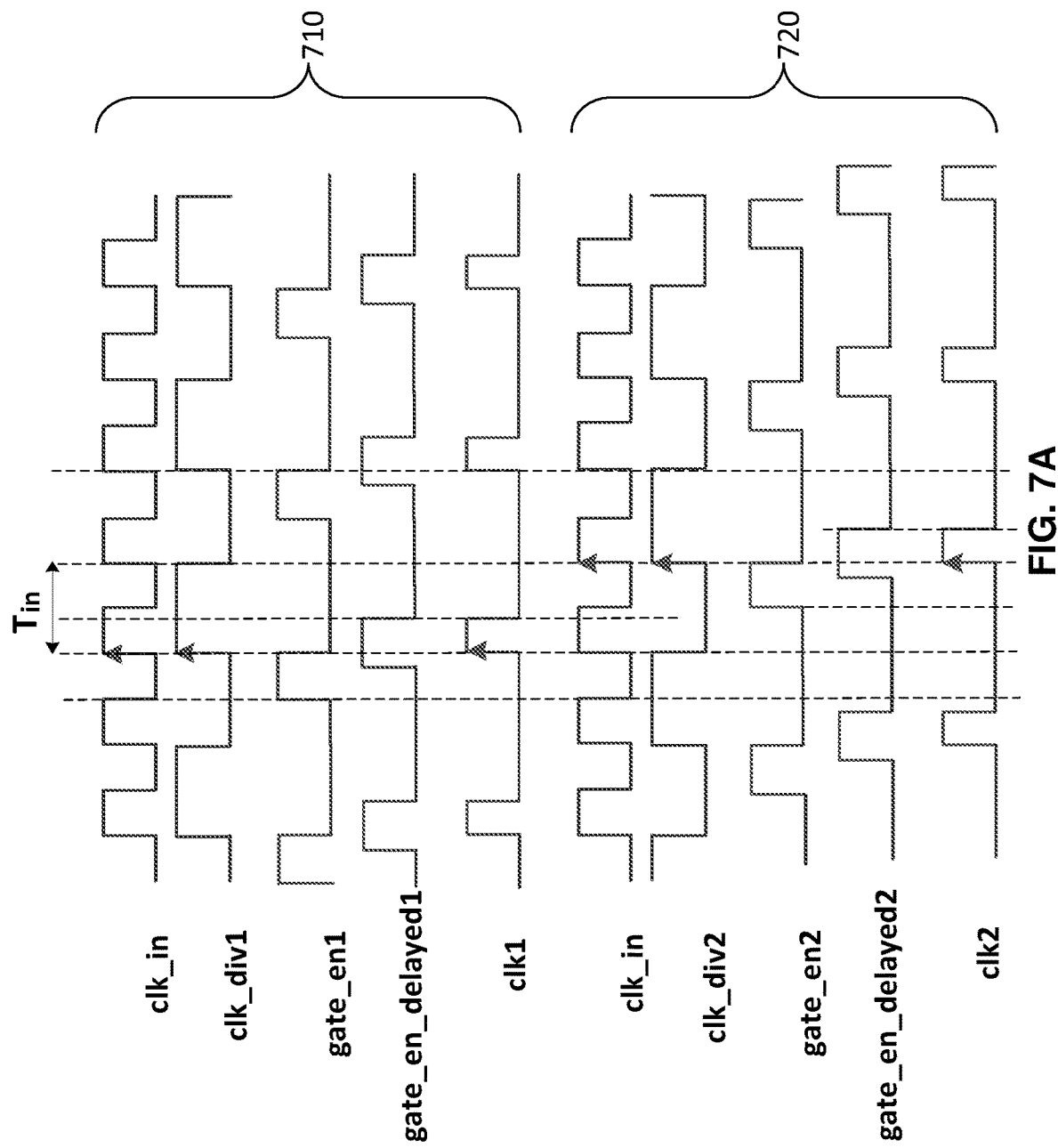

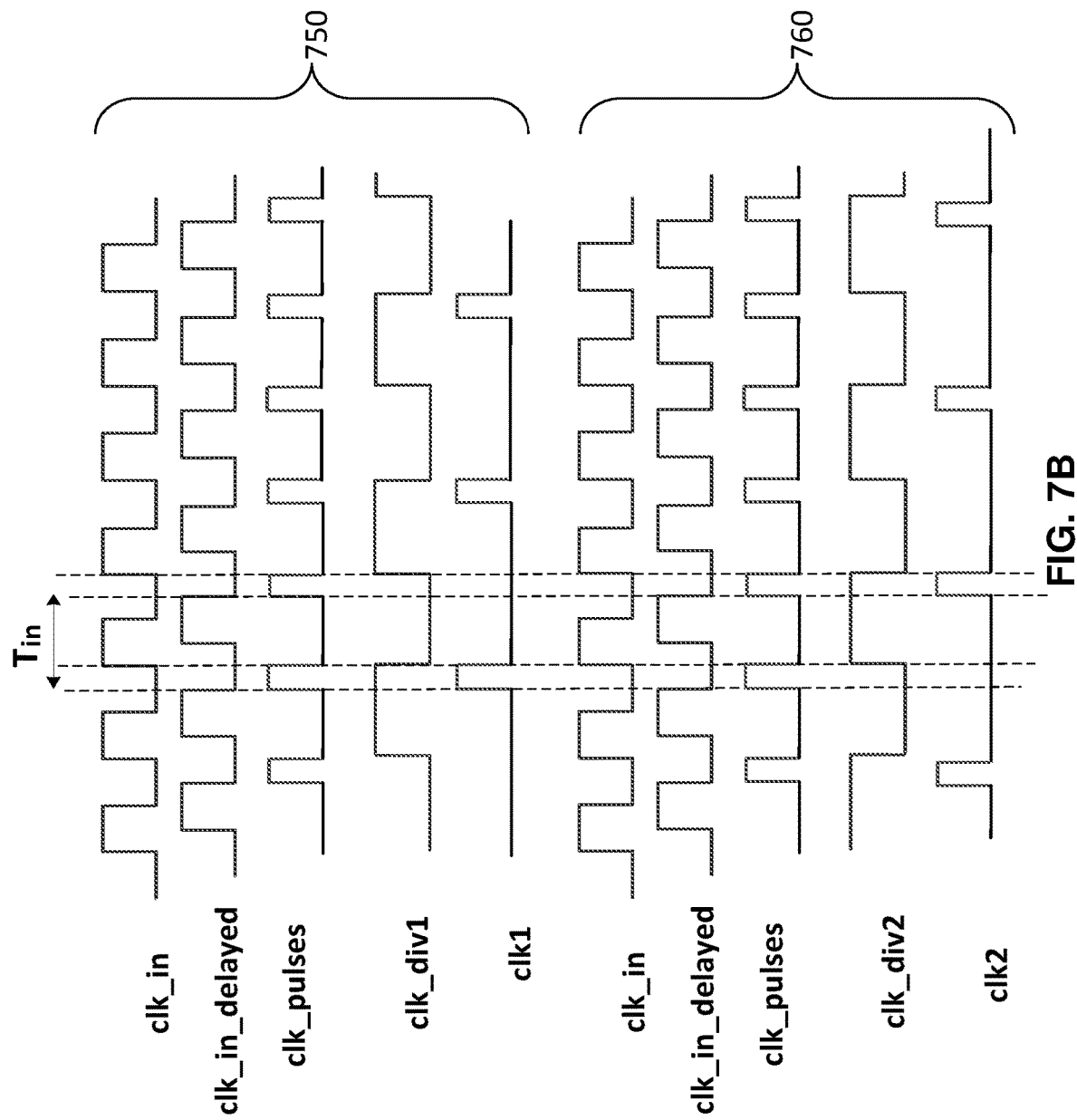

CLOCK DRIVER FOR TIME-INTERLEAVED DIGITAL-TO-ANALOG CONVERTER

BACKGROUND

Field

Aspects of the present disclosure relate generally to digital-to-analog converters (DACs), and more particularly, to time-interleaved DACs.

Background

High bandwidth communication systems require high-speed digital-to-analog conversion. One technique for achieving high-speed digital-to-analog conversion is time-interleaving two or more digital-to-analog converters (DACs), in which the two or more interleaved DACs alternately convert a digital signal into an analog signal.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a clock dividing circuit having an input, a first output, and a second output, wherein the input of the clock dividing circuit is configured to receive an input clock signal. The system also includes a first clock gating circuit having a first input, a second input, and an output, wherein the first input of the first clock gating circuit is configured to receive the input clock signal, and the second input of the first clock gating circuit is coupled to the first output of the clock dividing circuit. The system also includes a second clock gating circuit having a first input, a second input, and an output, wherein the first input of the second clock gating circuit is configured to receive the input clock signal, and the second input of the second clock gating circuit is coupled to the second output of the clock dividing circuit. The system also includes a first sub-digital-to-analog converter (sub-DAC) having a clock input coupled to the output of the first clock gating circuit, and a second sub-DAC having a clock input coupled to the output of the second clock gating circuit.

A second aspect relates to a system. The system includes a clock dividing circuit having an input, a first output, and a second output, wherein the input of the clock dividing circuit is configured to receive an input clock signal. The system also includes a first clock gating circuit having a first input, a second input, and an output, wherein the first input of the first clock gating circuit is configured to receive the input clock signal, and the second input of the first clock gating circuit is coupled to the first output of the clock dividing circuit. The system also includes a multiplexer having a first input, a second input, and an output, wherein the first input of the multiplexer is coupled to the first output of the clock dividing circuit, and the second input of the multiplexer is coupled to the second output of the clock dividing circuit. The system also includes a second clock gating circuit having a first input, a second input, and an output, wherein the first input of the second clock gating circuit is configured to receive the input clock signal, and the second input of the second clock gating circuit is coupled to the output of the multiplexer. The system also includes a first sub-digital-to-analog converter (sub-DAC) having a clock input coupled to the output of the first clock gating circuit, and a second sub-DAC having a clock input coupled to the output of the second clock gating circuit.

A third aspect relates to a method for providing a first drive clock signal and a second drive clock signal to a first sub-digital-to-analog converter (sub-DAC) and a second sub-DAC. The method includes receiving an input clock signal, and dividing the input clock signal to generate a first divided clock signal and a second divided clock signal. The method also includes gating the input clock signal using the first divided clock signal to generate the first drive clock signal, and inputting the first drive clock signal to a clock input of the first sub-DAC. The method further includes gating the input clock signal using the second divided clock signal to generate the second drive clock signal, and inputting the second drive clock signal to a clock input of the second sub-DAC.

BRIEF DESCRIPTION OF THE DRAWINGS

FIG. 6A shows an exemplary implementation of a clock gating circuit according to certain aspects of the present disclosure.

FIG. 6B shows another exemplary implementation of a clock gating circuit according to certain aspects of the present disclosure.

FIG. 7A is a timing diagram showing an example of signals in a first clock gating circuit and a second clock gating circuit in which each of the first clock gating circuit and the second clock gating circuit is implemented with the exemplary clock gating circuit in FIG. 6A according to certain aspects of the present disclosure.

FIG. 7B is a timing diagram showing an example of signals in a first clock gating circuit and a second clock gating circuit in which each of the first clock gating circuit and the second clock gating circuit is implemented with the exemplary clock gating circuit in FIG. 6B according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

High bandwidth communication systems require high-speed digital-to-analog conversion. One technique for achieving high-speed digital-to-analog conversion is time-interleaving two or more digital-to-analog converters (DACs), in which the two or more interleaved DACs alternately convert a digital signal into an analog signal. As used herein, a "DAC circuit" is a circuit including two or more DACs. Each of the two or more DACs in the DAC circuit may be referred to as a "sub-DAC".

Figure 1:
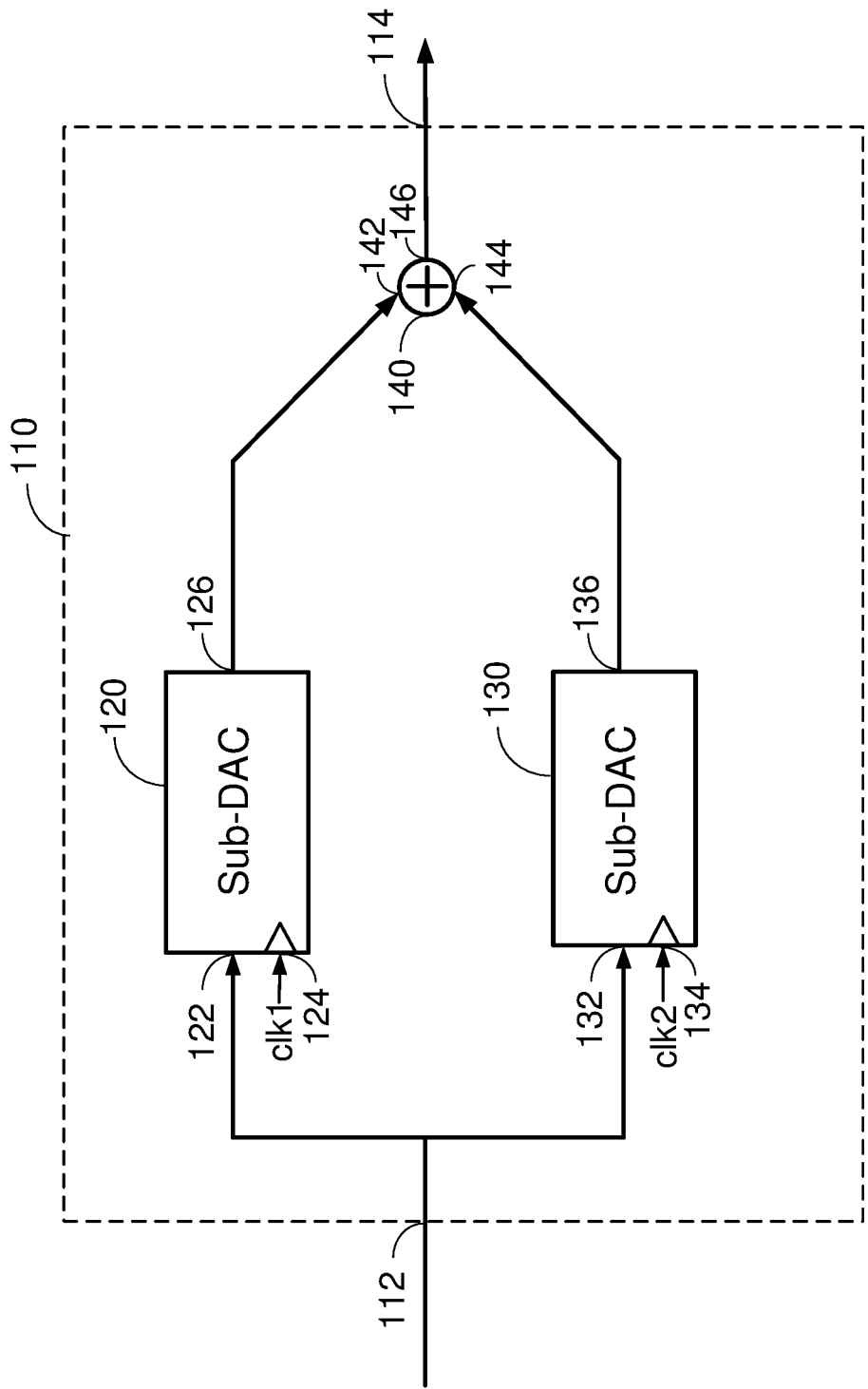
FIG. 1 shows an example of a time-interleaved digital-to-analog converter (DAC) circuit according to certain aspects of the present disclosure.

FIG. 1 shows an example of a DAC circuit 110 including a first sub-DAC 120, a second sub-DAC 130, and a combiner 140 according to certain aspects. The DAC circuit 110 has an input 112 configured to receive a digital signal, and an output 114. The first sub-DAC 120 has a data input 122, a clock input 124, and an output 126. The second sub-DAC 130 has a data input 132, a clock input 134, and an output 136. The data input 122 of the first sub-DAC 120 and the data input 132 of the second sub-DAC 130 are coupled to the input 112 of the DAC circuit 110. The combiner 140 has a first input 142 coupled to the output 126 of the first sub-DAC 120, a second input 144 coupled to the output 136 of the second sub-DAC 130, and an output 146 coupled to the output 114 of the DAC circuit 110. Although the output 126 of the first sub-DAC 120 and the output 136 of the second sub-DAC 130 are each shown as a single-ended output in FIG. 1, it is to be appreciated that output 126 of the first sub-DAC 120 and the output 136 of the second sub-DAC 130 may each be a differential output in some implementations.

The first sub-DAC 120 receives the digital signal at the data input 122, and a clock signal clk1 at the clock input 124. The first sub-DAC 120 is configured to convert the digital signal at the data input 122 into a first analog signal at the output 126. The first sub-DAC 120 is also configured to perform the digital-to-analog conversion of the digital signal based on the clock signal clk1. For example, the first sub-DAC 120 may be configured to sample digital values of the digital signal on edges (e.g., rising edges) of the clock signal clk1 and convert the sampled digital values into the first analog signal at the output 126. The clock signal clk1 may also be referred to as a first drive clock signal since the clock signal clk1 drives the clock input 124 of the first sub-DAC 120.

The second sub-DAC 130 receives the digital signal at the data input 132, and a clock signal clk2 at the clock input 134. The second sub-DAC 130 is configured to convert the digital signal at the data input 132 into a second analog signal at the output 136. The second sub-DAC 130 is also configured to perform the digital-to-analog conversion of the digital signal based on the clock signal clk2. For example, the second sub-DAC 130 may be configured to sample digital values of the digital signal on edges (e.g., rising edges) of the clock signal clk2 and convert the sampled digital values into the second analog signal at the output 136. The clock signal clk2 may also be referred to as a second drive clock signal since the clock signal clk2 drives the clock input 134 of the second sub-DAC 130.

The combiner 140 is configured to receive the first analog signal from the first sub-DAC 120 at the first input 142, receive the second analog signal from the second sub-DAC 130 at the second input 144, and combine the first analog signal and the second analog signal into a combined analog signal at the output 146. The combined analog signal is output at the output 114 of the DAC circuit 110. In some implementations, the combiner 140 may be implemented by shorting the output 126 of the first sub-DAC 120 and the output 136 of the second sub-DAC 130. Thus, the DAC circuit 110 converts the digital signal at the input 112 into the combined analog signal at the output 114.

As discussed above, the first sub-DAC 120 performs digital-to-analog conversion of the digital signal based on the clock signal clk1 and the second sub-DAC 130 performs digital-to-analog conversion of the digital signal based on the clock signal clk2. In certain aspects, the clock signal clk2 is phase shifted with respect to the clock signal clk1 by 180 degrees (i.e., half a clock period). This causes the first sub-DAC 120 and the second sub-DAC 130 to alternately perform digital-to-analog conversion. In certain aspects, each of the clock signal clk1 and the clock signal clk2 has a frequency of $F_s$. As a result, each of the first sub-DAC 120 and the second sub-DAC 130 performs digital-to-analog conversion at the frequency (i.e., rate) of $F_s$. Since the first sub-DAC 120 and the second sub-DAC alternately perform digital-to-analog conversion, the DAC circuit 110 can convert the digital signal at the input 112 into an analog signal (i.e., the combined analog signal at the output 114) at a frequency of $2F_s$ (i.e., twice the frequency of each of the sub-DACs 120 and 130). Thus, the DAC circuit 110 achieves a digital-to-analog conversion rate that is twice the digital-to-analog conversion rate of each of the sub-DACs 120 and 130.

A challenge with using the DAC circuit 110 is time skew between the sub-DACs 120 and 130, which degrades image attenuation and interleaving operations. For example, the time skew may be caused by a phase imbalance in which the clock signal clk2 is not precisely 180 degrees out of phase with the clock signal clk1. To address this, calibration techniques have been developed that measure image power due to time skew and reduce the time skew based on the measurement using a delay control circuit. However, the calibration techniques may be complex, require long calibration times, and consume a large amount of power and area.

Figure 2:
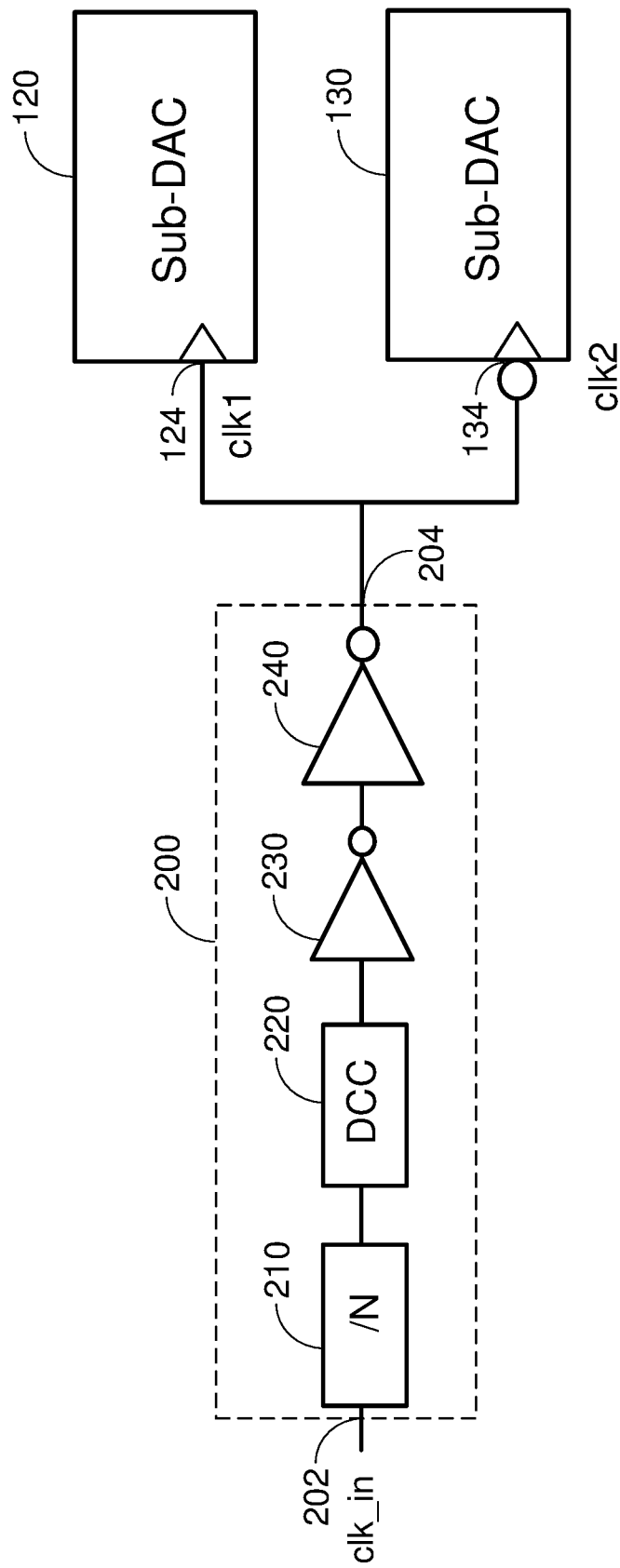
FIG. 2 shows an example of a clock circuit coupled to the time-interleaved DAC circuit according to certain aspects of the present disclosure.

FIG. 2 shows an existing clock circuit 200 for generating the clock signals clk1 and clk2. The clock circuit 200 includes a clock divider 210 (also referred to as a frequency divider), a duty cycle correction (DCC) block 220, and clock buffers 230 and 240 coupled in series. The clock circuit 200 is configured to output the clock signal clk1, which is input to the clock input 124 of the first sub-DAC 120. In this example, the second sub-DAC 130 has an inverting clock input 134 (indicated by the circle at the clock input 134), which means that the clock signal clk1 is inverted to provide the second sub-DAC 130 with the clock signal clk2. Note that the data inputs and the outputs of the sub-DACs 120 and 130 are not shown in FIG. 2 for ease of illustration.

In this example, the clock circuit 200 receives an input clock clk_in having a frequency of $2F_s$ at the input 202. The clock divider 210 divides the frequency of the input clock clk_in by two to provide a divided clock signal having a frequency of $F_s$. The DCC block 220 adjusts the duty cycle of the divided clock signal so that the clock signal clk1 at the output 204 has a duty cycle of approximately 50%. This helps ensure that the clock signal clk1 and the clock signal clk2 are approximately 180 degrees out of phase, as discussed further below. However, the DCC block 220 adds complexity, area, and power consumption to the clock circuit 200.

Figure 3:
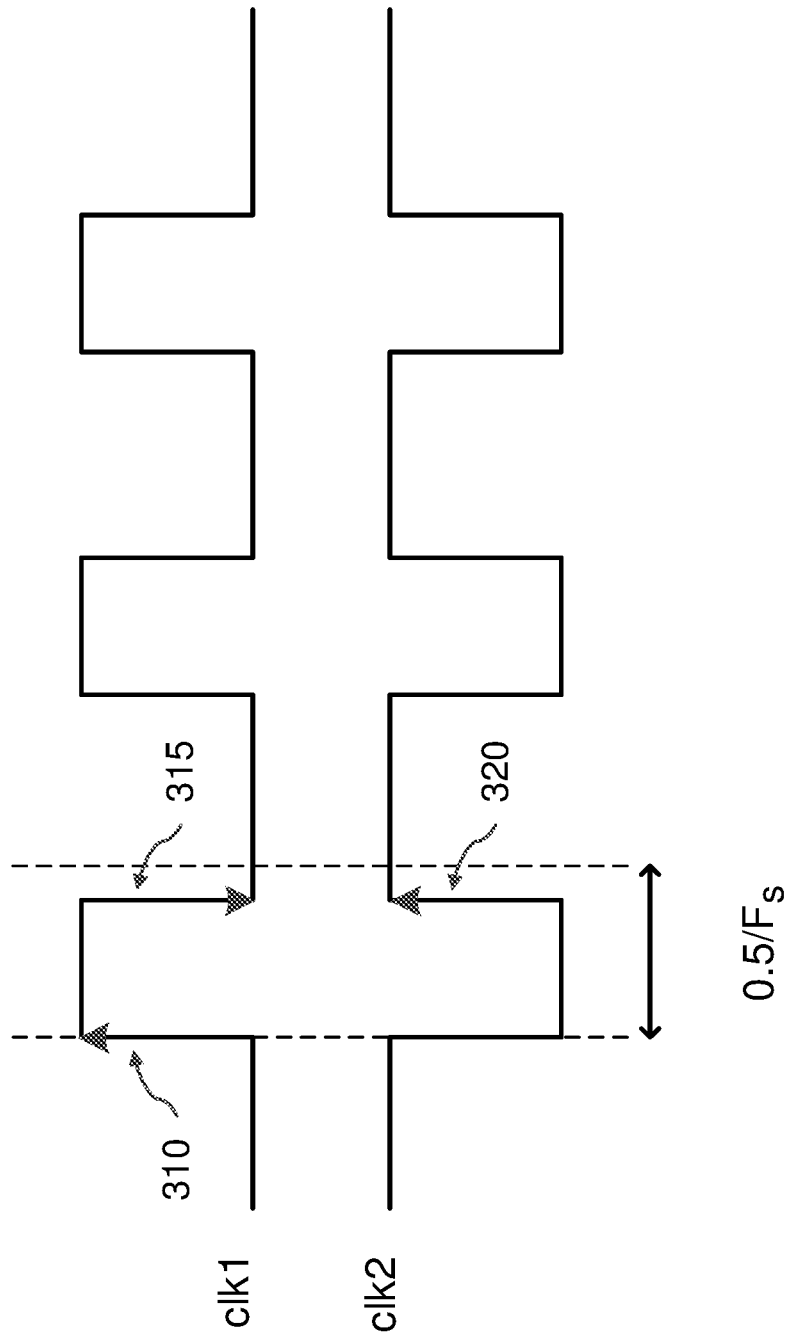
FIG. 3 is a timing diagram showing an example of clock signals input to the time-interleaved DAC circuit according to certain aspects of the present disclosure.

FIG. 3 is a timing diagram illustrating a case where the duty cycle of the clock signal clk1 is not corrected by the DCC block 220. Ideally, when the duty cycle of the clock signal clk1 is 50%, the rising edge 310 and the falling edge 315 are separated by half a clock period (i.e., $0.5/F_s$), which corresponds to a phase of 180 degrees. However, in the example shown in FIG. 3, the clock signal clk1 has a duty cycle less than 50%, which causes the separation between the rising edge 310 and falling edge 315 to be less than half a clock period. When the clock signal clk1 is inverted to provide the clock signal clk2, the falling edge 315 becomes a rising edge 320 of the clock signal clk2. As shown in FIG. 3, the duty cycle of less than 50% causes the phase difference between the rising edge 310 of the clock signal clk1 and the rising edge 320 of the clock signal clk2 to be out of phase by less than 180 degrees, resulting in time skew. Assuming each of the sub-DACs 120 and 130 performs digital-to-analog conversion on the rising edges of the respective clock signal, the time skew degrades time-interleaving operations of the DAC circuit 110.

Aspects of the present disclosure provide clock gating circuits for generating clock signals for sub-DACs having low time skew without the need for a DCC block or calibration, as discussed further below. In addition, aspects of the present disclosure provide output switches, multiplexers, and internal bypass switches that can be used with the clock gating circuits to handle various phase requirements for different modes (e.g., 4G mode and 5G mode in a transceiver).

Figure 4:
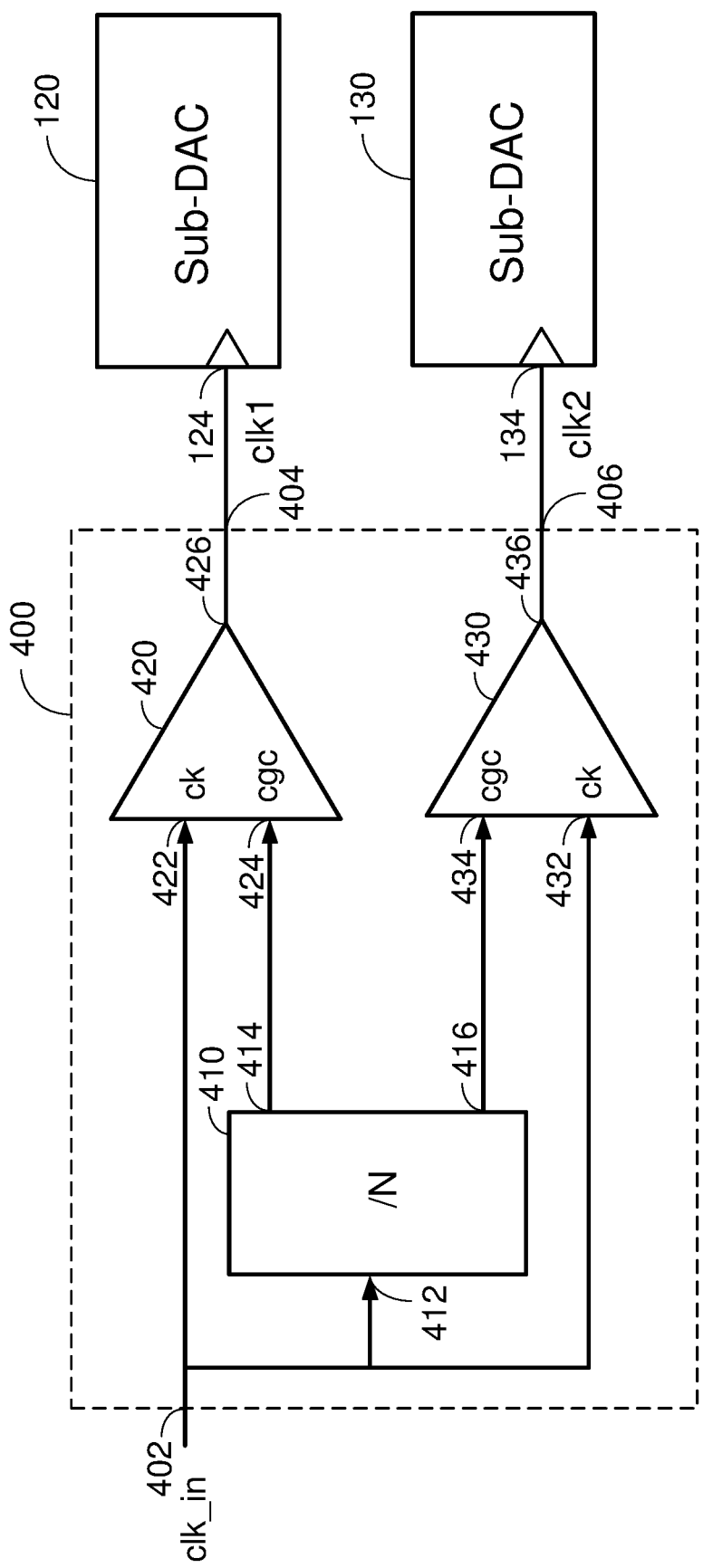
FIG. 4 shows an example of a clock circuit including clock gating circuits according to certain aspects of the present disclosure.

FIG. 4 shows an example of a clock circuit 400 (also referred to as a clock driver) according to certain aspects of the present disclosure. The clock circuit 400 includes a clock dividing circuit 410 (also referred to as a frequency divider), a first clock gating circuit (CGC) 420, and a second CGC 430. The clock circuit 400 has an input 402, a first output 404, and a second output 406. The input 402 is configured to receive an input clock signal clk_in from a clock source (e.g., phase locked loop (PLL)). The first output 404 is coupled to the clock input 124 of the first sub-DAC 120 and the second output 406 is coupled to the clock input 134 of the second sub-DAC 130.

The clock dividing circuit 410 has an input 412, a first output 414, and a second output 416. The input 412 is coupled to the input 402 of the clock circuit 400, and is configured to receive the input clock signal clk_in. In one example, the input clock signal clk_in has a frequency of $2F_s$. The clock dividing circuit 410 is configured to divide the frequency of the input clock signal clk_in to generate a first divided clock signal and a second divided clock signal. In certain aspects, the second divided clock signal is approximately 180 degrees out of phase with the first divided clock signal, as discussed further below. In one example, the clock dividing circuit 410 is configured to divide the frequency of the input clock signal clk_in by two, in which the first divided clock signal and the second divided clock signal each has a frequency of $F_s$. However, it is to be appreciated that the present disclosure is not limited to this example, and that the clock dividing circuit 410 may divide the frequency of the input clock signal clk_in by another divisor to generate the first divided clock signal and the second divided clock signal. The clock dividing circuit 410 outputs the first divided clock signal at the first output 414 and outputs the second divided clock signal at the second output 416.

The first CGC 420 has a first input 422, a second input 424, and an output 426. The first input 422 is coupled to the input 402 of the clock circuit 400 to receive the input clock signal clk_in, and the second input 424 is coupled to the first output 414 of the clock dividing circuit 410 to receive the first divided clock signal. The output 426 is coupled to the first output 404 of the clock circuit 400, which is coupled to the clock input 124 of the first sub-DAC 120. In operation, the first CGC 420 is configured to gate the input clock signal clk_in using the first divided clock signal to generate the clock signal clk1 for the first sub-DAC 120.

The second CGC 430 has a first input 432, a second input 434, and an output 436. The first input 432 is coupled to the input 402 of the clock circuit 400 to receive the input clock signal clk_in, and the second input 434 is coupled to the second output 416 of the clock dividing circuit 410 to receive the second divided clock signal. The output 436 is coupled to the second output 406 of clock circuit 400, which is coupled to the clock input 134 of the second sub-DAC 130. In operation, the second CGC 430 is configured to gate the input clock signal clk_in using the second divided clock signal to generate the clock signal clk2 for the second sub-DAC 130.

To generate clock signals clk1 and clk2 that are 180 degrees out of phase, the first CGC 420 and the second CGC 430 may gate alternate pulses of the input clock signal clk_in. For example, the first CGC 420 may gate even pulses of the input clock signal clk_in using the first divided clock signal to generate the clock signal clk1, and the second CGC 430 may gate odd pulses of the input clock signal clk_in using the second divided clock signal to generate the clock signal clk2, or vice versa.

Figure 5:
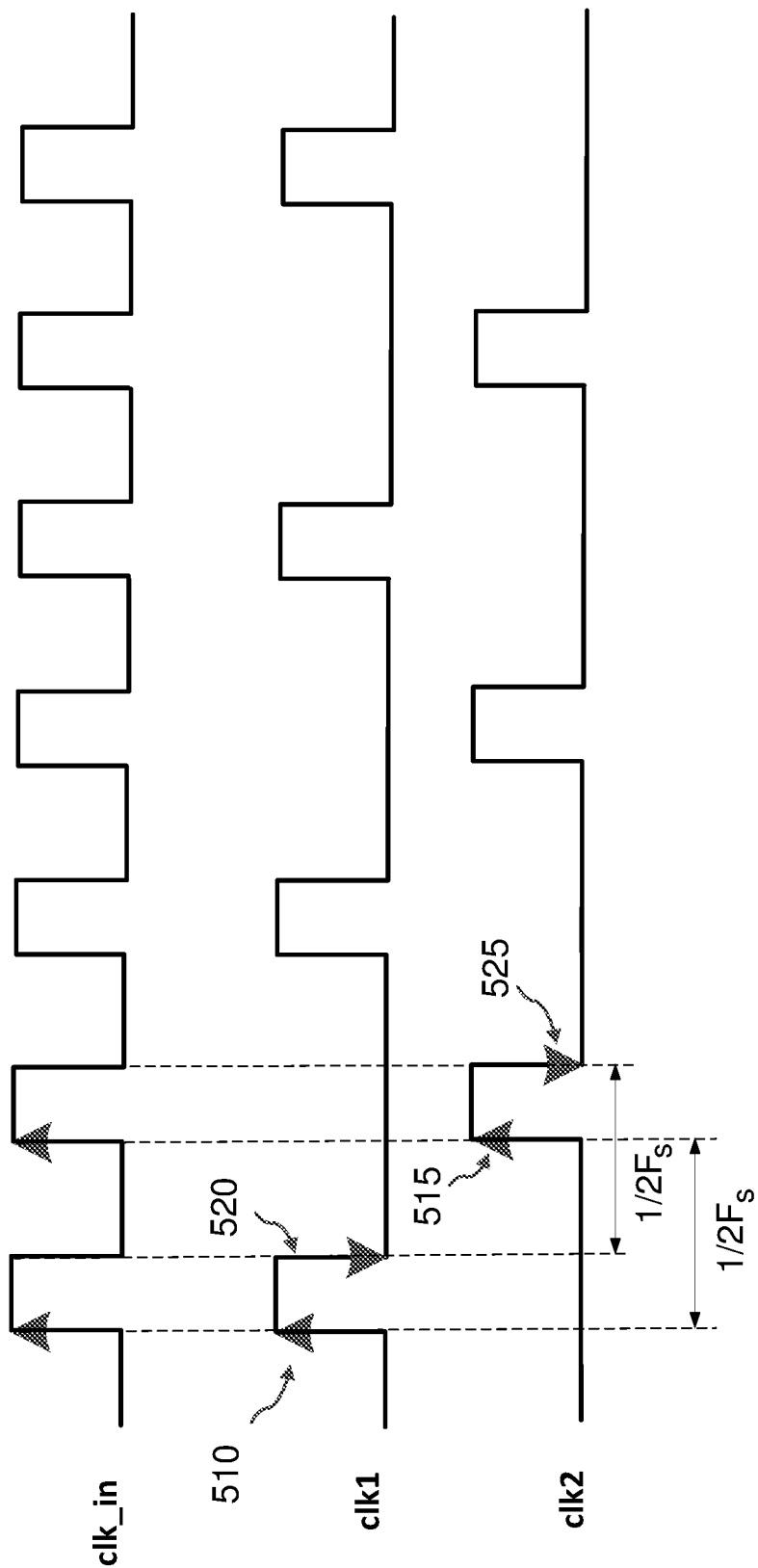
FIG. 5 is a timing diagram showing an example of clock signals in the clock circuit of FIG. 4 according to certain aspects of the present disclosure.

An example of the clock gating is illustrated in FIG. 5, which shows an exemplary timing diagram of the input clock signal clk, the clock signal clk1, and the clock signal clk2. In this example, the first CGC 420 gates even pulses of the input clock signal clk_in to generate the clock signal clk1, and the second CGC 430 gates odd pulses of the input clock signal clk_in to generate the clock signal clk2. As shown in FIG. 5, this results in the rising edges 510 and 515 of the clock signals clk1 and clk2 being spaced apart by one period of the input clock signal clk_in, which is equal to $\frac{1}{2}F_s$ since the input clock signal clk_in has a frequency of $2F_s$. The input clock period $\frac{1}{2}F_s$ is equivalent to $0.5/F_s$ which is precisely 180 degrees apart for the clock frequency of $F_s$, which is frequency of each of the clock signals clk1 and clk2. Thus, the rising edges 510 and 515 of the clock signals clk1 and clk2 are 180 degrees apart. Assuming each of the sub-DACs 120 and 130 performs digital-to-analog conversion on the rising edges of the respective clock signal, the clock signals clk1 and clk2 cause the sub-DACs 120 and 130 to perform digital-to-analog conversion 180 degrees out of phase with each other. This allows the first sub-DAC 120 and the second sub-DAC 130 to operate in a time-interleaved fashion (e.g., in the DAC circuit 110 shown in FIG. 1).

The rising edges 510 and 515 of the clock signals clk1 and clk2 are 180 degrees apart even when the duty cycle of the input clock signal clk_in is not 50%. This is because, unlike the example shown in FIG. 3, the clock circuit 400 does not generate the rising edges of the clock signal clk2 by inverting the falling edges of the clock signal clk1, which is sensitive to the duty cycle of the clock signal clk1. For example, FIG. 5 shows an example in which the input clock signal clk_in has a duty cycle less than 50%. As shown in FIG. 5, the rising edges 510 and 515 of the clock signals clk1 and clk2 are 180 degrees apart even though the input clock signal clk_in has a duty cycle less than 50%. The same applies for the case where the input clock signal clk_in has a duty cycle greater than 50%. Thus, the clock circuit 400 is able to generate clock signals clk1 and clk2 that are 180 degrees apart without the need for duty cycle correction by the DCC block 220 block in FIG. 2.

Note that the falling edges 520 and 525 of the clock signals clk1 and clk2 are also spaced 180 degrees apart in the example in FIG. 5. As a result, the clock signals clk1 and clk2 cause the sub-DACs 120 and 130 to perform digital-to-analog conversion 180 degrees out of phase with each other for the case where each of the sub-DACs 120 and 130 performs digital-to-analog conversion on the falling edges of the respective clock signal. Thus, the clock circuit 400 may be used for the case where each of the sub-DACs 120 and 130 performs digital-to-analog conversion on the rising edges of the respective clock signal, or the case where each of the sub-DACs 120 and 130 performs digital-to-analog conversion on the falling edges of the respective clock signal.

FIG. 6A shows an exemplary implementation of a CGC 610 according to certain aspects. The exemplary CGC 610 may be used to implement each of the first CGC 420 and the second CGC 430 in FIG. 4 (i.e., each of the first CGC 420 and the second CGC 430 may be a separate instance of the CGC 610).

In this example, the CGC 610 has a first input 612, a second input 614, and an output 616. For the example where the CGC 610 implements the first CGC 420, the first input 612 corresponds to the first input 422, the second input 614 corresponds to the second input 424, and the output 616 corresponds to the output 426. In this example, the first input 612 receives the input clock signal clk_in and the second input 614 receives the first divided clock signal from the clock dividing circuit 410. For the example where the CGC 610 implements the second CGC 430, the first input 612 corresponds to the first input 432, the second input 614 corresponds to the second input 434, and the output 616 corresponds to the output 436. In this example, the first input 612 receives the input clock signal clk_in and the second input 614 receives the second divided clock signal from the clock dividing circuit 410. As discussed above, the second divided clock signal is 180 degrees out of phase with the first divided clock signal according to certain aspects.

In this example, the CGC 610 includes a NOR gate 620, a delay circuit 630, and an AND gate 640. The NOR gate 620 has a first input 622 coupled to the first input 612 of the CGC 610, a second input 624 coupled to the second input 614 of the CGC 610, and an output 626. The AND gate 640 has a first input 642, a second input 644 coupled to the first input 612 of the CGC 610, and an output 646 coupled to the output 616 of the CGC 610. The delay circuit 630 is coupled between the output 626 of the NOR gate 620 and the first input 642 of the AND gate 640. It is to be appreciated that each of the NOR gate 620 and the AND gate 640 may be implemented with a combination of logic gates in some implementations. For example, the AND gate 640 may be implemented with a NAND gate and an inverter in some implementations.

For the example where the CGC 610 implements the first CGC 420, the NOR gate 620 receives the input clock signal clk_in and the first divided clock signal from the clock dividing circuit 410. The NOR gate 620 then generates an internal clock gating signal (labeled "gate_en") by performing a NOR operation on the first divided clock signal and the input clock signal clk_in. The delay circuit 630 delays the clock gating signal by a time delay, which may be programmable. As discussed further below, the time delay controls the pulse width of the clock signal clk1. In FIG. 6A, the delayed clock gating signal is labeled "gate_en_delayed".

The AND gate 640 receives the delayed clock gating signal and the input clock signal clk_in. The AND gate 640 then gates the input clock signal clk_in using the delayed clock gating signal to generate the clock signal clk1. In this example, the AND gate 640 gates the input clock signal clk_in by performing an AND operation on the input clock signal clk_in and the delayed clock gating signal.

FIG. 7A is a timing diagram showing exemplary signals 710 in the first CGC 420 for the example where the first CGC 420 is implemented with the CGC 610 according to certain aspects. In the example in FIG. 7A, the signals 710 includes the input clock signal clk_in, the first divided clock signal (labeled "clk_div1"), the clock gating signal (labeled "gate_en1"), the delayed clock gating signal (labeled "gate_en_delayed1"), and the clock signal clk1. The pulse width of the clock signal clk1 may be adjusted by adjusting the delay of the delay circuit 630. The longer the delay, the wider the pulse width.

For the example where the CGC 610 implements the second CGC 430, the NOR gate 620 receives the input clock signal clk_in and the second divided clock signal from the clock dividing circuit 410. The NOR gate 620 then generates an internal clock gating signal (labeled "gate_en") by performing a NOR operation on the second divided clock signal and the input clock signal clk_in. The delay circuit 630 delays the clock gating signal by a time delay, which may be programmable.

The AND gate 640 receives the delayed clock gating signal (labeled "gate_en_delayed") and the input clock signal clk_in. The AND gate 640 then gates the input clock signal clk_in using the delayed clock gating signal to generate the clock signal clk2. In this example, the AND gate 640 gates the input clock signal clk_in by performing an AND operation on the input clock signal clk_in and the delayed clock gating signal.

FIG. 7A also shows exemplary signals 720 in the second CGC 430 for the example where the second CGC 430 is implemented with the CGC 610 according to certain aspects. In the example in FIG. 7A, the signals 720 include the input clock signal clk_in, the second divided clock signal (labeled "clk_div2"), the clock gating signal (labeled "gate_en2"), the delayed clock gating signal (labeled "gate_en_delayed2"), and the clock signal clk2. In the example in FIG. 7A, the second divided clock signal is 180 degrees out of phase with the first divided clock signal (i.e., the rising edges of the second divided clock signal are shifted 180 degrees apart from the rising edges of the first divided clock signal). In this example, the second divided clock signal may be generated by inverting the first divided clock signal or another technique.

As shown in FIG. 7A, the clock signal clk1 and the clock signal clk2 are spaced apart by one period (labeled "$T_{in}$") of the input clock signal clk_in. One clock period of the input clock signal clk_in is equivalent to 180 degrees for the clock signals clk1 and clk2 since the input clock signal clk_in has a frequency equal to twice the frequency of each of the clock signals clk1 and clk2 in this example. Thus, in this example, the clock signals clk1 and clk2 are out of phase by 180 degrees.

It is to be appreciated the first CGC 420 and the second CGC 430 are not limited to the exemplary implementation shown in FIG. 6A, and that each of the first CGC 420 and the second CGC 430 may be implemented using various logic gates and various arrangements of logic gates. In this regard, FIG. 6B shows another exemplary implementation of the CGC 610 in which the arrangement of the NOR gate 620 and the delay circuit 630 are changed with respect to FIG. 6A. In this example, the delay circuit 630 is coupled between the first input 612 of the CGC 610 and the first input 622 of the NOR gate 620, the second input 624 of the NOR gate 620 is coupled to the first input 612 of the CGC 610, and the output 626 of the NOR gate 620 is coupled to the first input 642 of the AND gate 640. The second input 644 of the AND gate 640 is coupled to the second input 614 of the CGC 610.

In this example, the delay circuit 630 delays the input clock signal clk_in to generate a delayed input clock signal (labeled "clk_in_delayed"). The NOR gate 620 performs a NOR operation on the input clock signal and the delayed input clock signal to generate clock pulses in which the width of the clock pulses is controlled by the time delay of the delay circuit 630. For the example where the CGC 610 implements the first CGC 420, the AND gate 640 gates the clock pulses with the first divided clock signal to generate the clock signal clk1. For the example where the CGC 610 implements the second CGC 430, the AND gate 640 gates the clock pulses with the second divided clock signal to generate the clock signal clk2. It is to be appreciated that the operations of the NOR gate 620 and the AND gate 640 may be performed by other combinations of logic gates.

FIG. 7B is a timing diagram showing exemplary signals 750 for the example where the CGC 610 in FIG. 6B implements the first CGC 420. FIG. 7B also shows exemplary signals 760 for the example where the CGC 610 in FIG. 6B implements the second CGC 430. As shown in FIG. 7B, the resulting clock signals clk1 and clk2 are shifted with respect to each other by one period of the input clock signal clk_in (labeled "$T_{in}$"), which corresponds to a phase of 180 degrees for the clock signals clk1 and clk2. The pulse width of each of the clock signals clk1 and clk2 is controlled by the time delay of the respective delay circuit.

In general, it is to be appreciated that each of the first CGC 420 and the second CGC 430 may include logic gates for gating the input clock signal clk_in using the first divided clock signal or the second divided clock signal, and may include a delay circuit for adjusting the pulse width of the respective one of the clock signals clk1 and clk2.

Figure 8:
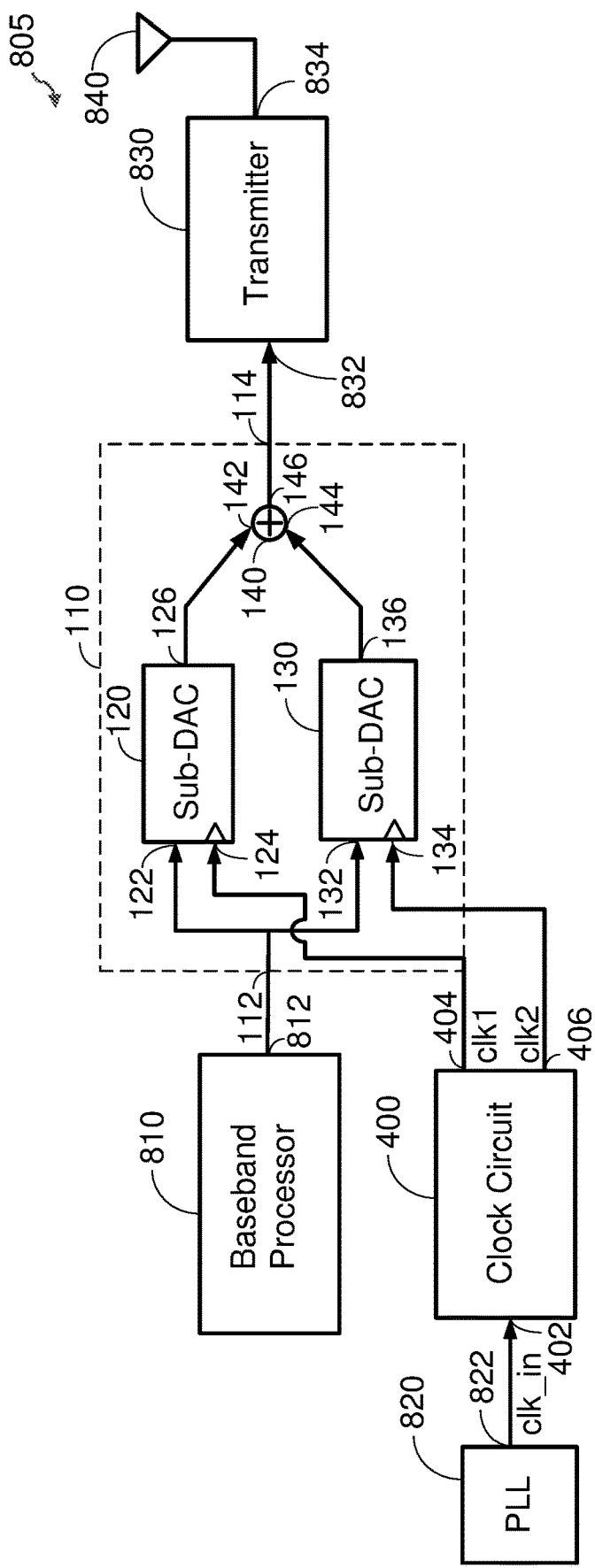
FIG. 8 shows an example of a wireless device including a clock circuit and a DAC circuit according to certain aspects of the present disclosure.

FIG. 8 shows an example of a wireless device 805 including the clock circuit 400 and the DAC circuit 110 according to certain aspects. In this example, the wireless device 805 also includes a phase locked loop (PLL) 820, a baseband processor 810, a transmitter 830, and an antenna 840.

The PLL 820 has an output 822 coupled to the input 402 of the clock circuit 400. In this example, the PLL 820 is configured to generate the input clock signal clk_in, and output the input clock signal clk_in at the output 822. The clock circuit 400 receives the generated input clock signal clk_in via the input 402.

The clock circuit 400 outputs the clock signal clk1 to the clock input 124 of the first sub-DAC 120 and outputs the clock signal clk2 to the clock input 134 of the second sub-DAC 130. As discussed above, the clock signals clk2 and clk2 may be out of phase by 180 degrees to operate the sub-DACs 120 and 130 in a time-interleaved fashion. This allows the DAC circuit 110 to perform digital-to-analog conversion at a frequency (i.e., rate) of $2F_s$ where $F_s$ is the frequency of each of the clock signals clk1 and clk2.

The input 112 of the DAC circuit 110 is coupled to an output 812 of the baseband processor 810 (also referred to as a modem). The baseband processor 810 is configured to receive data to be transmitted (e.g., from another processor), generate a digital baseband signal including the data, and output the digital baseband signal at the output 812. The DAC circuit 110 receives the digital baseband signal via the input 112 and converts the digital baseband signal into an analog baseband signal at the output 114.

The transmitter 830 has an input 832 coupled to the output 114 of the DAC circuit 110 and an output 834 coupled to the antenna 840. The transmitter 830 is configured to receive the analog baseband signal, process the analog baseband signal into a radio frequency (RF) signal, and output the RF signal at the output 834 to the antenna 840 for transmission.

Figure 9:
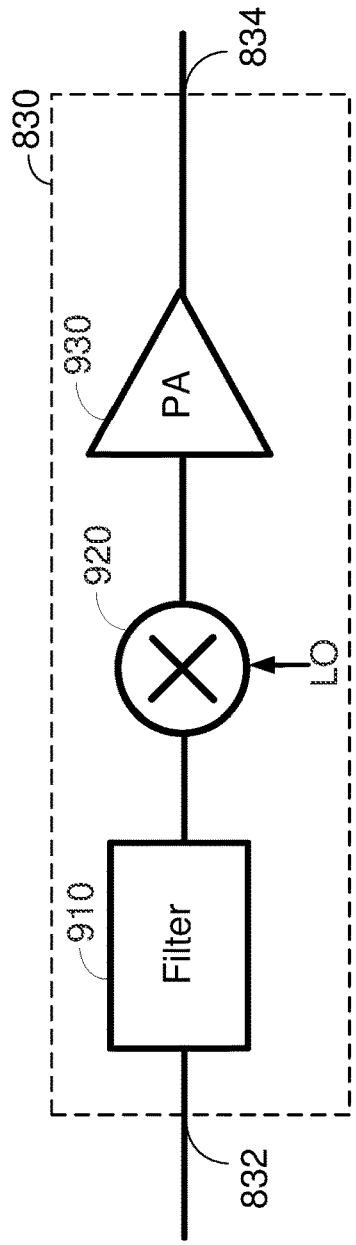
FIG. 9 shows an exemplary implementation of a transmitter according to certain aspects of the present disclosure.

In one example, processing performed by the transmitter 830 may include frequency upconversion, filtering, power amplification, and/or other processing. In this regard, FIG. 9 shows an exemplary implementation of the transmitter 830 in which the transmitter 830 may include a filter 910, a mixer 920, and a power amplifier 930 coupled in a chain. The filter 910 may include a baseband filter and/or a low pass filer. The mixer 920 may be configured to mix the baseband signal with a local oscillator signal (labeled "LO") to frequency upconvert the baseband signal to the RF signal. The power amplifier 930 is configured to amplify the RF signal for transmission via the antenna 840. It is to be appreciated that the transmitter 830 may include one or more additional components not shown in FIG. 9. Although one antenna 840 is shown in FIG. 8, it is to be appreciated that the wireless device 805 may include multiple antennas (e.g., arranged in an array) coupled to the transmitter 830.

Figure 10:
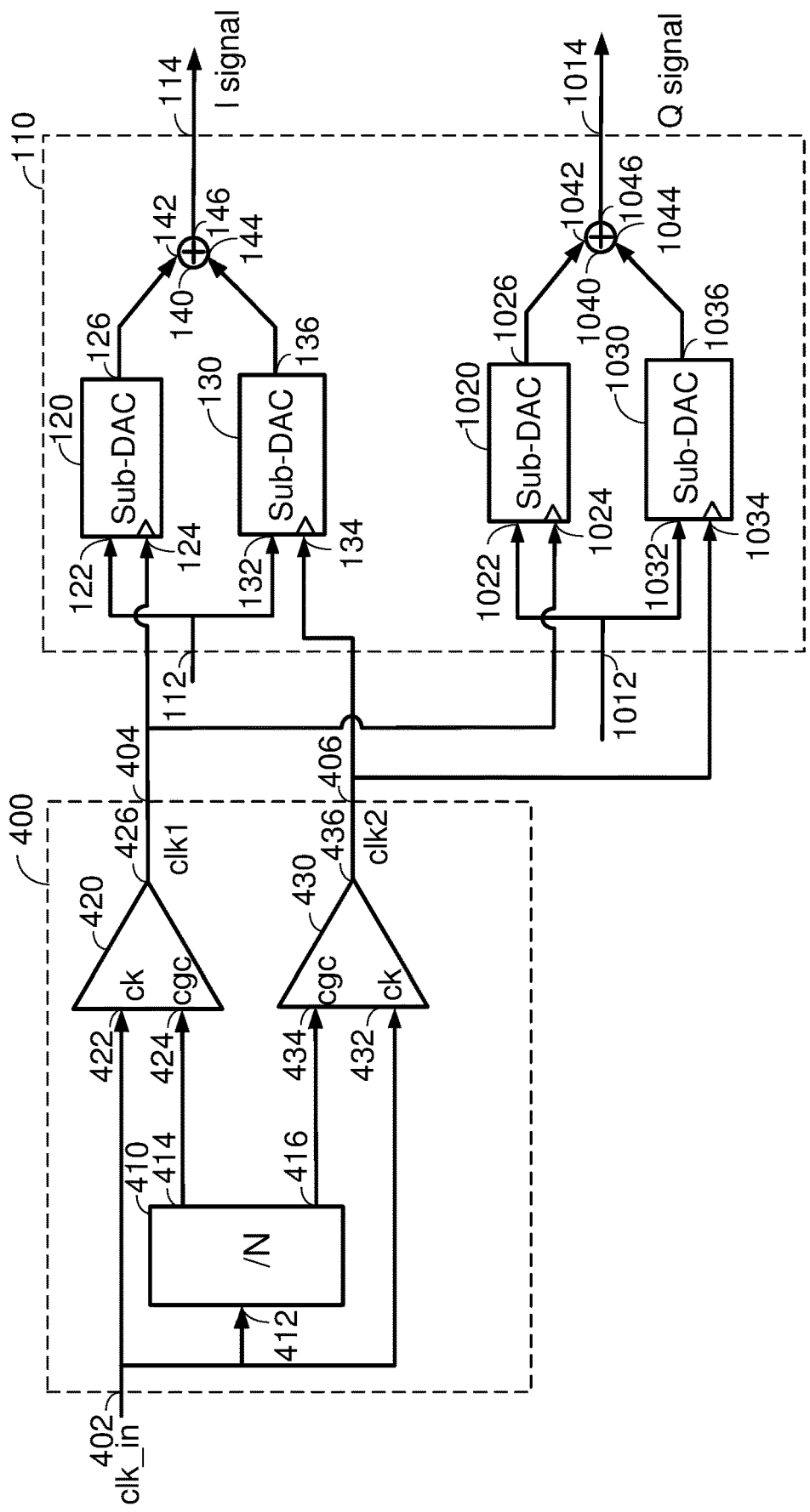
FIG. 10 shows an example of a clock circuit driving clock inputs of multiple sub-DACs according to certain aspects of the present disclosure.

It is to be appreciated that the clock circuit 400 is not limited to two sub-DACs 120 and 130, and that the clock circuit 400 may be used to drive the clock inputs of more than two sub-DACs. In this regard, FIG. 10 shows an example in which the DAC circuit 110 includes a third sub-DAC 1020, a fourth sub-DAC 1030, and a second combiner 1040 according to certain aspects. In this example, the DAC circuit 110 has a second input 1012 configured to receive a digital signal, and a second output 1014. The third sub-DAC 1020 has a data input 1022 coupled to the second input 1012, a clock input 1024 coupled to the first output 404 of the clock circuit 400, and an output 1026. The fourth sub-DAC 1030 has a data input 1032 coupled to the second input 1012, a clock input 1034 coupled to the second output 406 of the clock circuit 400, and an output 1036. The combiner 1040 has a first input 1042 coupled to the output 1026 of the third sub-DAC 1020, a second input 1044 coupled to the output 1036 of the fourth sub-DAC 1030, and an output 1046 coupled to the second output 1014.

The third sub-DAC 1020 receives the digital signal at the data input 1022, and the clock signal clk1 from the clock circuit 400 at the clock input 1024. The third sub-DAC 1020 is configured to convert the digital signal at the data input 1022 into a first analog signal at the output 1026. The third sub-DAC 1020 is also configured to perform the digital-to-analog conversion of the digital signal based on the clock signal clk1.

The fourth sub-DAC 1030 receives the digital signal at the data input 1032, and the clock signal clk2 from the clock circuit 400 at the clock input 1034. The fourth sub-DAC 1030 is configured to convert the digital signal at the data input 1032 into a second analog signal at the output 1036. The fourth sub-DAC 1030 is also configured to perform the digital-to-analog conversion of the digital signal based on the clock signal clk2.

The combiner 1040 is configured to receive the first analog signal from the third sub-DAC 1020 at the first input 1042, receive the second analog signal from the fourth sub-DAC 1030 at the second input 1044, and combine the first analog signal and the second analog signal into a combined analog signal at the output 1046. The combined analog signal is output at the output 1014 of the DAC circuit 110. In some implementations, the combiner 1040 may be implemented by shorting the output 1026 of the third sub-DAC 1020 and the output 1036 of the fourth sub-DAC 1030.

As discussed above, the clock signal clk2 is phase shifted with respect to the clock signal clk1 by 180 degrees (i.e., half a clock period). This causes the third sub-DAC 1020 and the fourth sub-DAC 1030 to alternately perform digital-to-analog conversion to provide an effective digital-to-analog conversion rate of $2F_s$, where $F_s$ is the frequency of each of the clock signals clk1 and clk2.

In certain aspects, the exemplary DAC circuit 110 shown in FIG. 10 may be used in a wireless device employing in-phase (I) and quadrature (Q) modulation. In this example, the first sub-DAC 120 and the second sub-DAC 130 may be used to generate an analog in-phase (I) signal and the third sub-DAC 1020 and the fourth sub-DAC 1030 may be used to generate an analog quadrature (Q) signal. In this regard, FIG. 11 shows an exemplary implementation of the transmitter 830 configured to receive the analog I signal and the analog Q signal, and convert the analog I signal and the analog Q signal into an RF signal for transmission.

Figure 11:
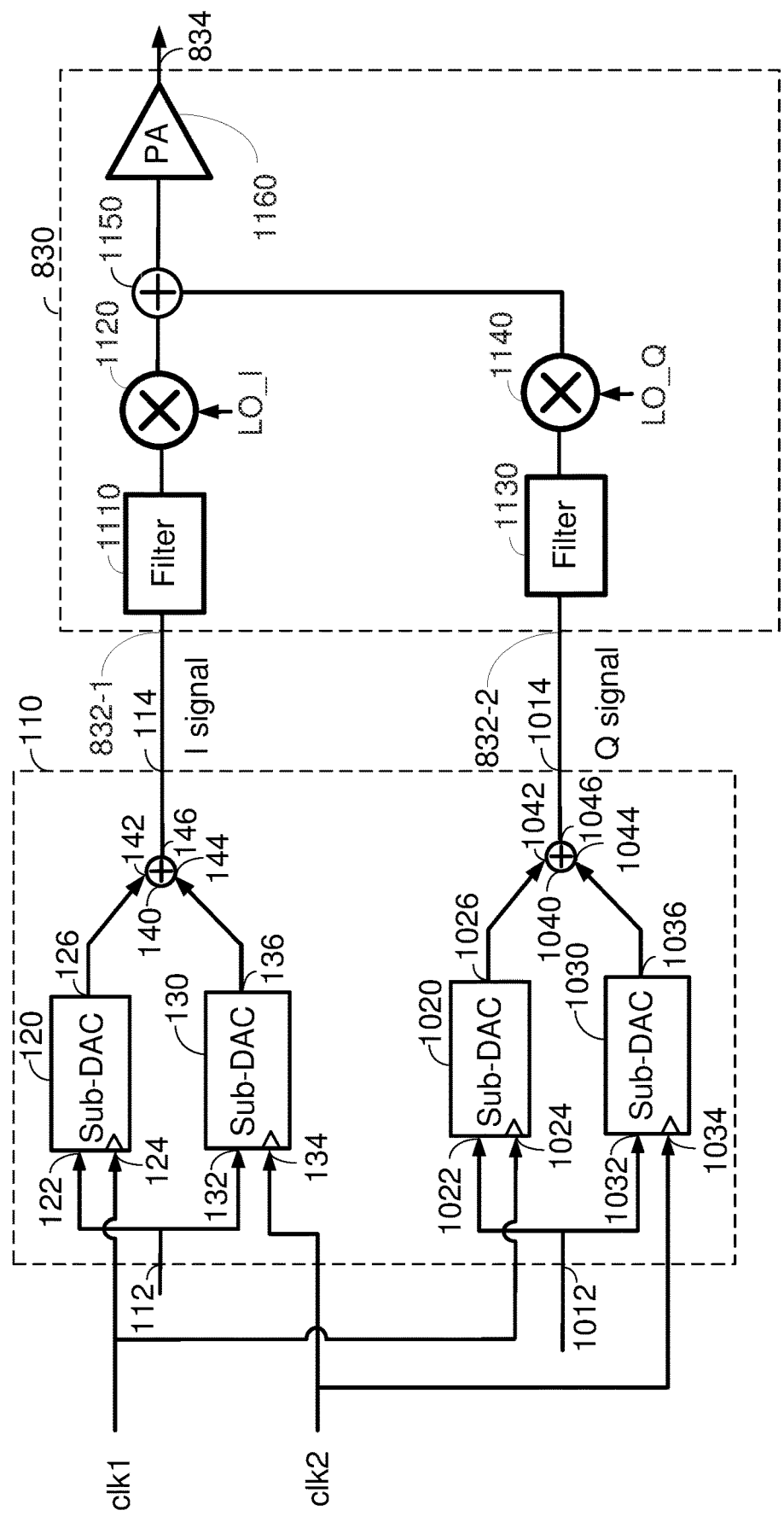
FIG. 11 shows an exemplary implementation of a transmitter including an in-phase path and a quadrature path according to certain aspects of the present disclosure.

In the example in FIG. 11, the transmitter 830 includes an in-phase (I) path including a first filter 1110 and a first mixer 1120 coupled in a chain. The I path is coupled to the output 114 of the DAC circuit 110 via a first input 832-1. The first filter 1110 may include a baseband filter, a low pass filter, etc. The first mixer 1120 is configured to mix the analog I signal with a first local oscillator signal (labeled "LO_I") to frequency upconvert the analog I signal to a first RF signal.

The transmitter 830 also includes a quadrature (Q) path including a second filter 1130 and a second mixer 1140 coupled in a chain. The Q path is coupled to the second output 1014 of the DAC circuit 110 via a second input 832-2. The second filter 1130 may include a baseband filter, a low pass filter, etc. The second mixer 1140 is configured to mix the analog Q signal with a second local oscillator signal (labeled "LO_Q") to frequency upconvert the analog Q signal to a second RF signal. The second local oscillator signal may be 90 degrees out of phase with the first local oscillator signal.

The transmitter 830 also includes a combiner 1150 coupled to the first mixer 1120 and the second mixer 1140, and a power amplifier 1160 coupled to the combiner 1150. The combiner 1150 is configured to combine the first RF signal and the second RF signal into a combined RF signal, and output the combined RF signal to the power amplifier 1160. The power amplifier 1160 amplifies the combined RF signal and outputs the resulting amplified RF signal at the output 834. It is to be appreciated that the transmitter 830 may include one or more additional components not shown in FIG. 11.

Figure 12:
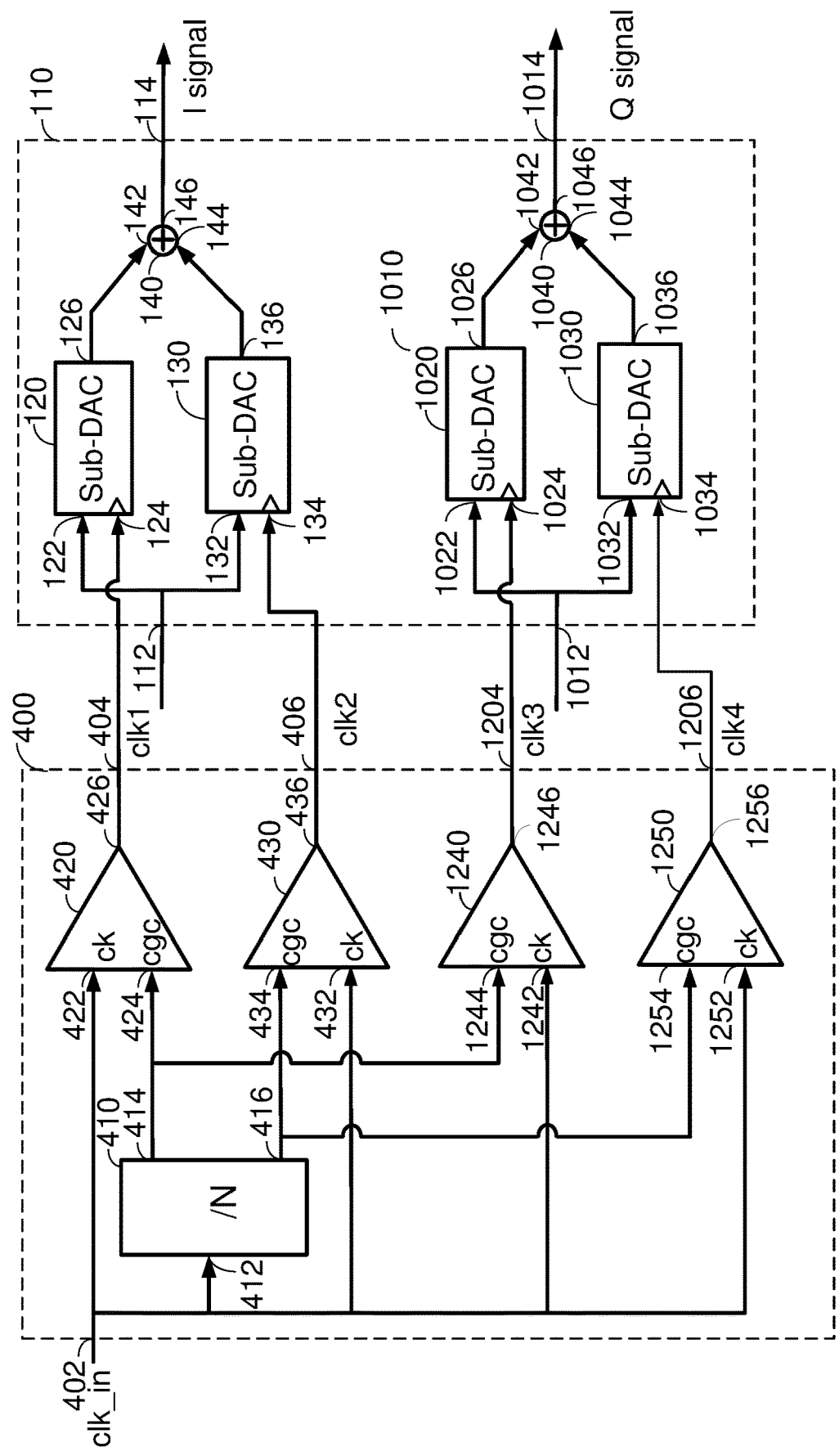
FIG. 12 shows an example of a clock circuit including multiple clock gating circuits according to certain aspects of the present disclosure.

In certain aspects, the clock circuit 400 may include one or more additional CGCs for driving the clock inputs 1024 and 1034 of the third sub-DAC 1020 and the fourth sub-DAC 1030 instead of using the CGCs 420 and 430. In this regard, FIG. 12 shows an example in which the clock circuit 400 further includes a third CGC 1240 and the fourth CGC 1250 for driving the clock inputs 1024 and 1034 of the third sub-DAC 1020 and the fourth sub-DAC 1030.

The third CGC 1240 has a first input 1242, a second input 1244, and an output 1246. The first input 1242 is coupled to the input 402 of the clock circuit 400 to receive the input clock signal clk_in, and the second input 1244 is coupled to the first output 414 of the clock dividing circuit 410 to receive the first divided clock signal. The output 1246 is coupled to a third output 1204 of the clock circuit 400, which is coupled to the clock input 1024 of the third sub-DAC 1020. In one example, the third CGC 1240 may be implemented with the exemplary CGC 610 shown in FIG. 6A or FIG. 6B. In operation, the third CGC 1240 is configured to gate the input clock signal clk_in using the first divided clock signal to generate a clock signal clk3 for the third sub-DAC 1020.

The fourth CGC 1250 has a first input 1252, a second input 1254, and an output 1256. The first input 1252 is coupled to the input 402 of the clock circuit 400 to receive the input clock signal clk_in, and the second input 1254 is coupled to the second output 416 of the clock dividing circuit 410 to receive the second divided clock signal. The output 1256 is coupled to a fourth output 1206 of the clock circuit 400, which is coupled to the clock input 1034 of the fourth sub-DAC 1030. In one example, the fourth CGC 1250 may be implemented with the exemplary CGC 610 shown in FIG. 6A or FIG. 6B. In operation, the fourth CGC 1250 is configured to gate the input clock signal clk_in using the second divided clock signal to generate a clock signal clk4 for the fourth sub-DAC 1030.

In certain aspects, the clock signals clk3 and clk4 that are 180 degrees out of phase, which causes the third sub-DAC 1020 and the fourth sub-DAC 1030 to alternately perform digital-to-analog conversion to provide an effective digital-to-analog conversion rate of $2F_s$, where $F_s$ is the frequency of each of the clock signals clk3 and clk4.

Figure 13A:
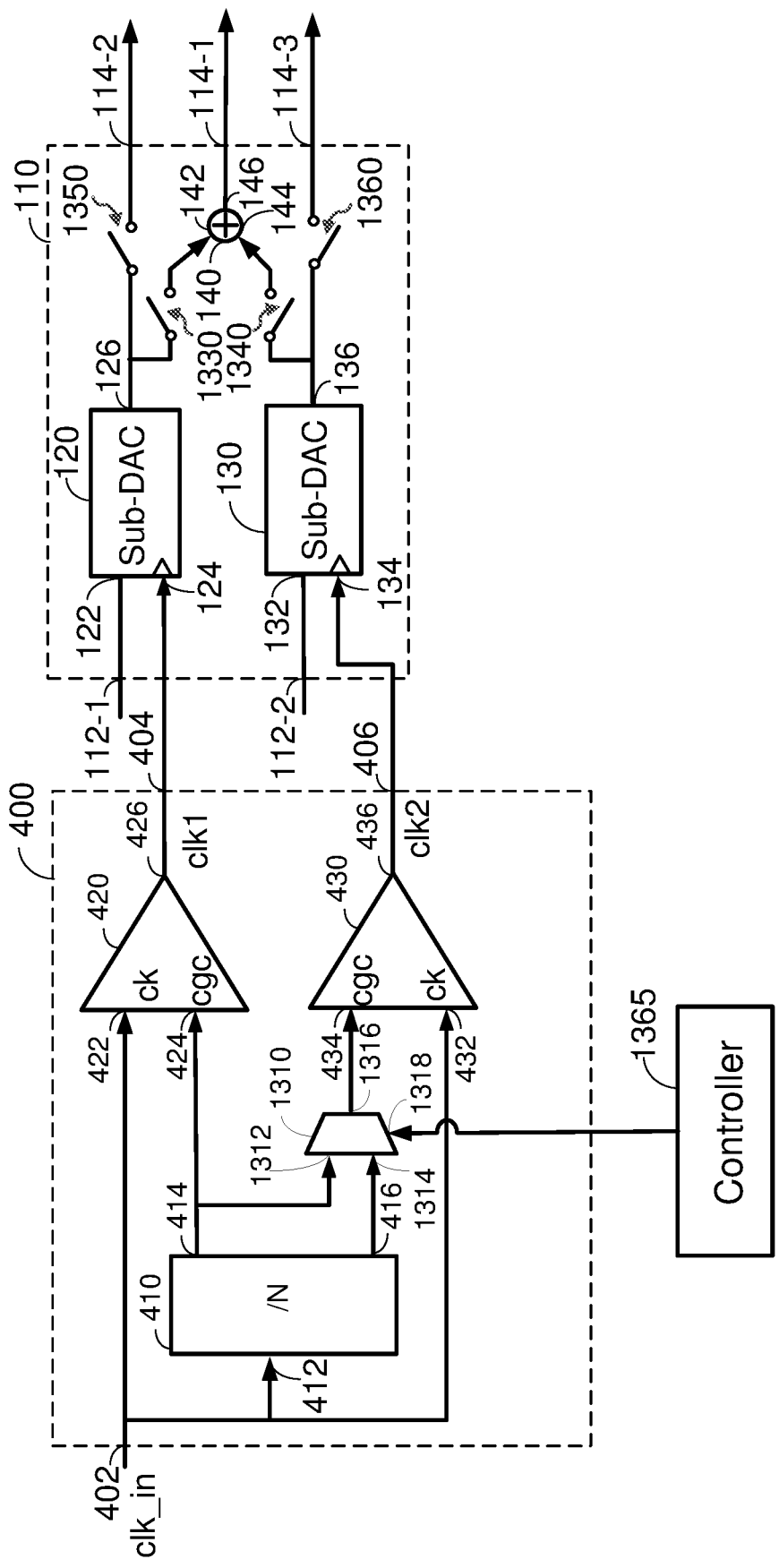
FIG. 13A shows an example of a programmable clock circuit and a programmable DAC circuit according to certain aspects of the present disclosure.

In certain aspects, the clock circuit 400 and the DAC circuit 110 may be programmable to handle two or more modes. In this regard, FIG. 13A shows an example in which the clock circuit 400 and the DAC circuit 110 may switch between a first mode and a second mode. In the first mode, the first sub-DAC 120 and the second sub-DAC 130 operate in a time-interleaved fashion, as discussed above with reference to FIG. 4. In the second mode, the first sub-DAC 120 and the second sub-DAC 130 perform digital-to-analog conversion on separate channels. In other words, the first sub-DAC 120 and the second sub-DAC 130 are not time-interleaved in the second mode, as discussed further below.

In this example, the clock circuit 400 includes a multiplexer 1310 having a first input 1312, a second input 1314, a select input 1318, and an output 1316. The first input 1312 is coupled to the first output 414 of the clock dividing circuit 410, the second input 1314 is coupled to the second output 416 of the clock dividing circuit 410, and the output 1316 is coupled to the second input 434 of the second CGC 430. In operation, the multiplexer 1310 is configured to receive a select signal from a controller 1365 via the select input 1318, select the first input 1312 or the second input 1314 based on the select signal, and couple the selected one of the first input 1312 and the second input 1314 to the output 1316 of the multiplexer 1310. In this example, the first input 1312 receives the first divided clock signal and the second input 1314 receives the second divided clock signal. Thus, the multiplexer 1310 inputs the first divided clock signal to the second input 434 of the second CGC 430 when the first input 1312 is selected, and inputs the second divided clock signal to the second input 434 of the second CGC 430 when the second input 1314 is selected.

In this example, the DAC circuit 110 has a first input 112-1 coupled to the data input 122 of the first sub-DAC 120, a second input 112-2 coupled to the data input 132 of the second sub-DAC 130, and a first output 114-1 coupled to the output 146 of the combiner 140. The DAC circuit 110 also includes a second output 114-2 and a third output 114-3 for the second mode, as discussed further below.

In this example, the DAC circuit 110 includes a first output switch 1330, a second output switch 1340, a third output switch 1350, and a fourth output switch 1360. The first output switch 1330 is coupled between the output 126 of the first sub-DAC 120 and the first input 142 of the combiner 140. The second output switch 1340 is coupled between the output 136 of the second sub-DAC 130 and the second input 144 of the combiner 140. The third output switch 1350 is coupled between the output 126 of the first sub-DAC 120 and the second output 114-2. The fourth output switch 1360 is coupled between the output 136 of the second sub-DAC 130 and the third output 114-3. The output switches 1330, 1340, 1350, and 1360 are controlled by the controller 1365. For ease of illustration, the individual connections between the controller 1365 and the output switches 1330, 1340, 1350, and 1360 are not explicitly shown in FIG. 13A. The first output 114-1, the second output 114-2, and the third output 114-3 may also be referred to a first DAC output, a second DAC output, and a third DAC output, respectively.

In the first mode, the controller 1365 causes the multiplexer 1310 to select the second input 1314. Thus, in the first mode, the multiplexer 1310 inputs the second divided clock signal to the second input 434 of the second CGC 430. As a result, the clock signal clk2 is 180 degrees out of phase with the clock signal clk1, which causes the sub-DACs 120 and 130 to alternately perform digital-to-analog conversion in a time-interleaved fashion. In this mode, the same digital signal may be input to the first input 112-1 and the second input 112-2.

Also, in the first mode, the controller 1365 closes (i.e., turns on) the first output switch 1330 and the second output switch 1340, and opens (i.e., turns off) the third output switch 1350 and the fourth output switch 1360. As a result, the output 126 of the first sub-DAC 120 and the output 136 of the second sub-DAC 130 are coupled to the combiner 140, which combines the analog signals from the sub-DACs 120 into a combined analog signal and outputs the combined analog signal at the first output 114-1. In the first mode, the DAC circuit 110 outputs the combined analog signal at an effective digital-to-analog conversion rate of $2F_s$ (also referred to as sampling rate).

In the second mode, the controller 1365 causes the multiplexer 1310 to select the first input 1312. Thus, in the second mode, the multiplexer 1310 inputs the first divided clock signal to the second input 434 of the second CGC 430. As a result, the clock signal clk2 is approximately in phase with the clock signal clk1 since both CGCs 420 and 430 use the first divided clock signal for gating the input clock signal clk_in. In this mode, a first digital signal may be input to the first input 112-1 and a second digital signal may be input the second input 112-2. The first sub_DAC 120 converts the first digital signal into a first analog signal, and the second sub-DAC 130 converts the second digital signal into a second analog signal.

Also, in the second mode, the controller 1365 opens (i.e., turns off) the first output switch 1330 and the second output switch 1340, and closes (i.e., turns on) the third output switch 1350 and the fourth output switch 1360. As a result, the output 126 of the first sub-DAC 120 is coupled to the second output 114-2, and output 136 of the second sub-DAC 130 is coupled to the third output 114-3. As a result, the first analog signal from the first sub-DAC 120 is output at the second output 114-2, and the second analog signal from the second sub-DAC 130 is output at the third output 114-3. Thus, in the second mode, the sub-DACs 120 and 130 perform digital-to-analog conversion on the respective digital signal in parallel. In the second mode, the first analog signal and the second analog signal each has a digital-to-analog conversion rate of $F_s$.

Figure 13B:
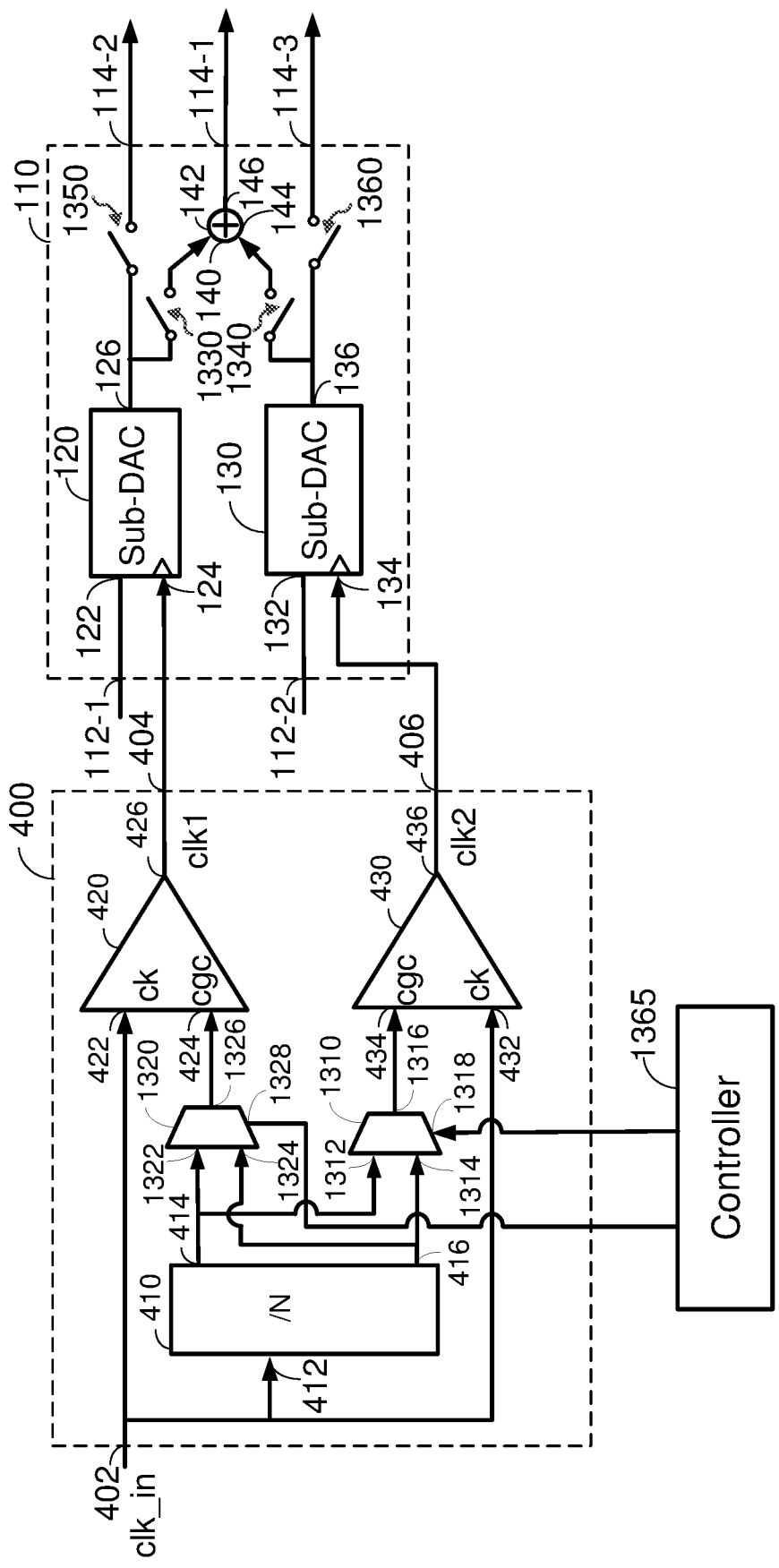
FIG. 13B shows an example of the programmable clock circuit in FIG. 13A including a second multiplexer according to certain aspects of the present disclosure.

It is to be appreciated that the clock circuit 400 is not limited to one multiplexer 1310. In this regard, FIG. 13B shows an example in which the clock circuit 400 includes a second multiplexer 1320 between the clock dividing circuit 410 and the first CGC 420 to provide additional programmability. In this example, the second multiplexer 1320 has a first input 1322 coupled to the first output 414 of the clock dividing circuit 410, a second input 1324 coupled to the second output 416 of the clock dividing circuit 410, a select input 1328 coupled to the controller 1365, and an output 1326 coupled to the second input 424 of the first CGC 420. In this example, the second multiplexer 1320 allows the controller 1365 to selectively input the first divided clock signal or the second divided clock signal to the second input 424 of the first CGC 420 (e.g., to support one or more additional modes of operation). The second multiplexer 1320 may also be used to provide propagation delay matching with the multiplexer 1310. In the first mode and the second mode discussed above, the controller 1365 causes the second multiplexer 1320 to select the first input 1322, which is coupled to the first output 414 of the clock dividing circuit 410. Thus, in the first mode and the second mode, the second multiplexer 1320 couples the second input 424 of the first CGC 420 to the first output 414 of the clock dividing circuit 410 to receive the first divided clock signal discussed above.

Figure 13C:
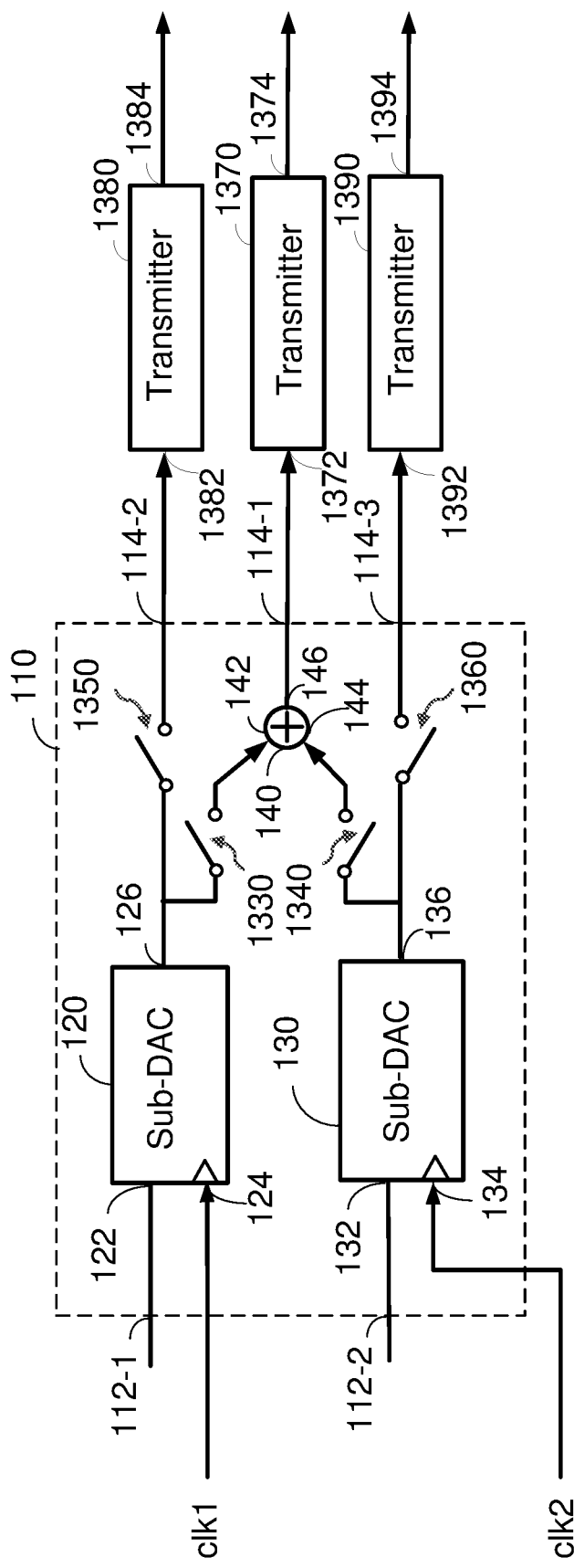
FIG. 13C shows an example of transmitters coupled to the programmable DAC circuit according to certain aspects of the present disclosure.

For the example where the clock circuit 400 and the DAC circuit 110 are used in a wireless device, the first input 112-1 and the second input 112-2 of the DAC circuit 110 may be coupled to the baseband processor 810 or another processor. Also, each of the outputs 114-1, 114-3, and 114-3 of the DAC circuit 110 may be coupled to a respective transmitter. In this regard, FIG. 13C shows an example in which the wireless device includes a first transmitter 1370 having an input 1372 coupled to the first output 114-1, a second transmitter 1380 having an input 1382 coupled to the second output 114-2, and a third transmitter 1390 having an input 1392 coupled to the third output 114-3. Each of the transmitters 1370, 1380, and 1390 may be implemented with a separate instance of the exemplary transmitter 830 shown in FIG. 9 or FIG. 11. In the first mode, the combined output of the first sub-DAC 120 and the second sub-DAC 130 is coupled to the first transmitter 1370. In the second mode, the output 126 of the first sub-DAC 120 is coupled to the second transmitter 1380 and the output 136 of the second sub-DAC 130 is coupled to the third transmitter 1390. The output 1374 of the first transmitter 1370, the output 1384 of the second transmitter 1380, and the output 1394 of the third transmitter 1390 may be coupled to separate antennas or a common antenna.

In some implementations, the first sub-DAC 120 may be used to generate the in-phase (I) signal and the second sub-DAC 130 may be used to generate the quadrature (Q) signal in the second mode. In this example, the second transmitter 1380 may be implemented with the I signal path of the transmitter 830 shown in FIG. 11 and the third transmitter 1390 may be implemented with the Q signal path of the exemplary transmitter 830 shown in FIG. 11, in which the input 1382 of the second transmitter 1380 correspond to the first input 832-1 shown in FIG. 11 and the input 1392 of the third transmitter 1390 corresponds to the second input 832-2 shown in FIG. 11. In this example, one instance of the transmitter 830 shown in FIG. 11 may be used to implement the second transmitter 1380 and the third transmitter 1390.

Figure 14:
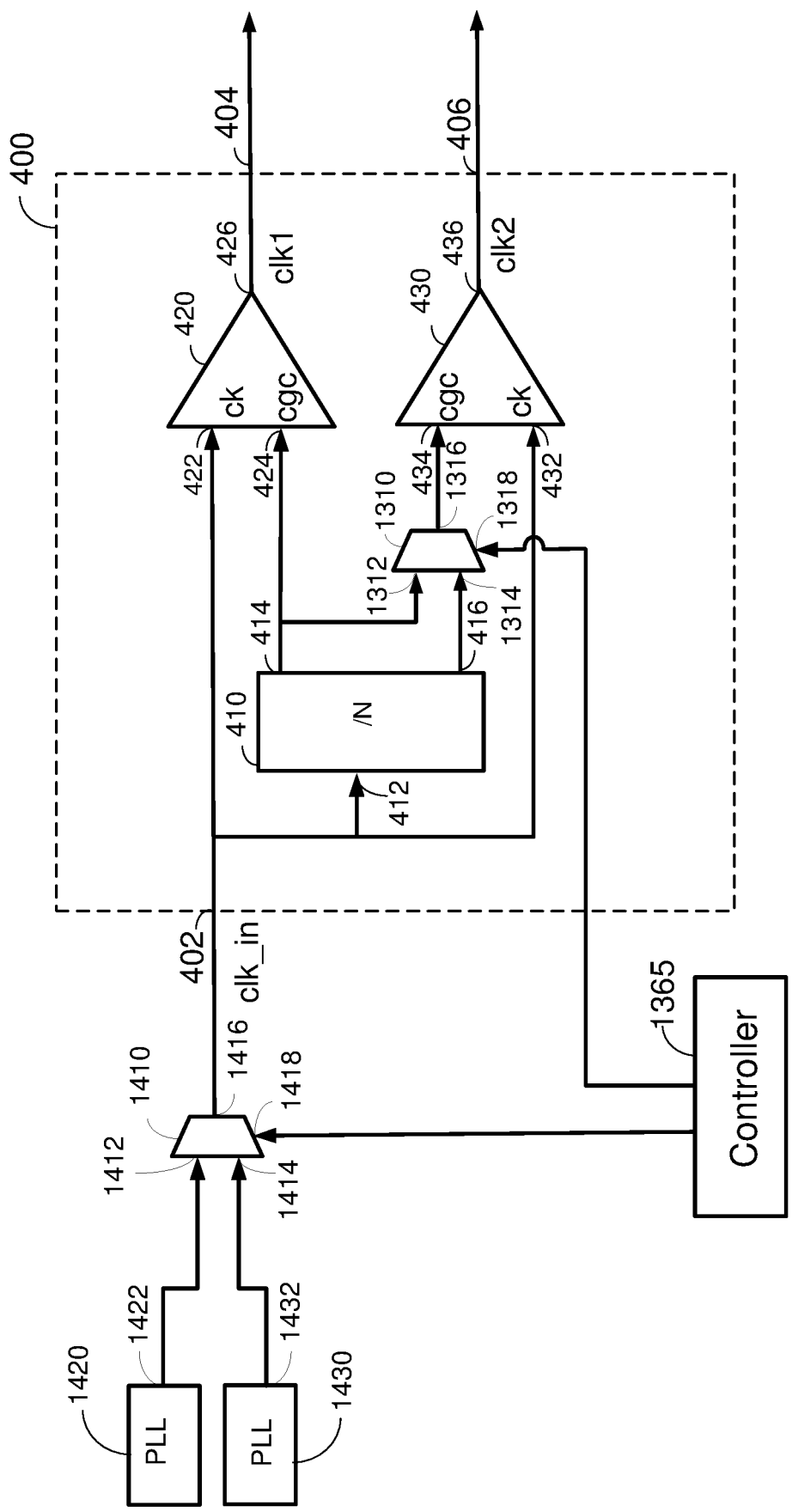
FIG. 14 shows an example of a clock multiplexer coupled to a clock circuit according to certain aspects of the present disclosure.

In certain aspects, the clock circuit 400 may use different sources for the input clock signal clk_in for different modes. In this regard, FIG. 14 shows an example of a system including the clock circuit 400, a clock multiplexer 1410, a first phase locked loop (PLL) 1420, and a second PLL 1430. In this example, the first PLL 1420 outputs a first root clock signal having a first frequency and the second PLL 1430 outputs a second root clock signal having a second frequency.

The clock multiplexer 1410 has a first input 1412 coupled to an output 1422 of the first PLL 1420, a second input 1414 coupled to an output 1432 of the second PLL 1430, a select input 1418 coupled to the controller 1365, and an output 1416 coupled to the input 402 of the clock circuit 400. The clock multiplexer 1410 is configured to selectively input the first root clock signal from the first PLL 1420 or the second root clock signal from the second PLL 1430 to the input 402 of the clock circuit 400 under the control of the controller 1365. In this example, the selected one of the first root clock signal and the second root clock signal becomes the input clock signal clk_in discussed above.

The controller 1365 may select the first root clock signal or the second root clock signal based on the mode of operation of the clock circuit 400 and the DAC circuit 110. For example, the controller 1365 may select the first root clock signal in the first mode discussed above and select the second root clock signal in the second mode discussed above. This feature allows the sub-DACs 120 and 130 to operate at different digital-to-analog conversion rates for the different modes.

Figure 15:
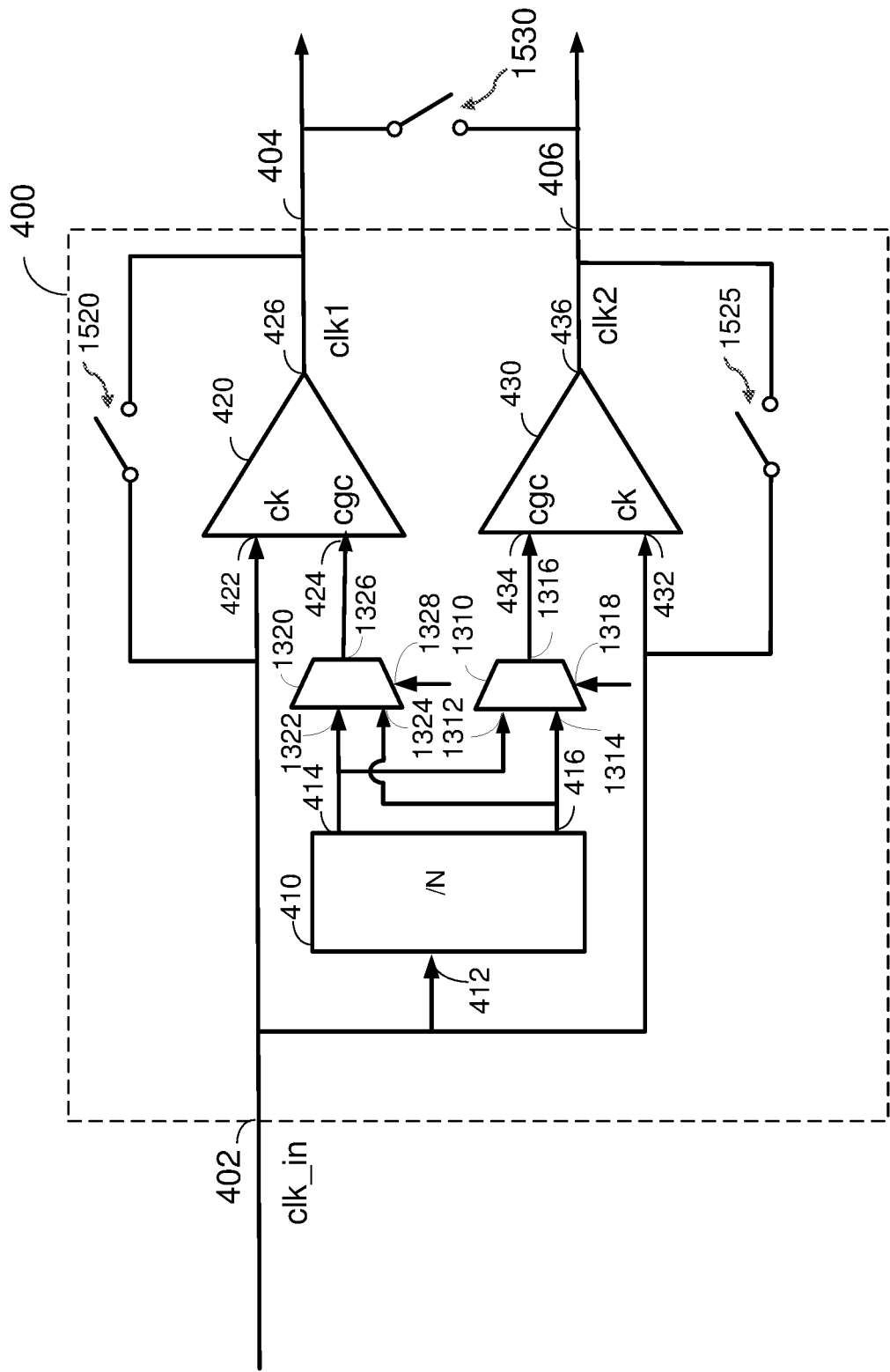
FIG. 15 shows an example of a clock circuit including bypass switches and a shorting switch according to certain aspects of the present disclosure.

FIG. 15 shows another example of the clock circuit 400 according to certain aspects. In this example, the clock circuit 400 may be coupled to the exemplary DAC circuit 110 shown in FIGS. 13A and 13B.

In this example, the clock circuit 400 may include a shorting switch 1530 coupled between the output 426 of the first CGC 420 and the output 436 of the second CGC 430. The shorting switch 1530 is controlled by the controller 1365 (shown in FIGS. 13A and 13B). In this example, the controller 1365 may selectively close (i.e., turn on) the shorting switch 1530 to short the first output 404 and the second output 406 of the clock circuit 400.

For example, in the second mode discussed above, the clock signals clk1 and clk2 may be approximately in phase since both the CGCs 420 and 430 receive the first divided clock signal in the second mode. In this mode, the controller 1365 may close the shorting switch 1530 to reduce any time skew between the clock signals clk1 and clk2. The skew may be caused by small variation between the CGCs 420 and 430 (e.g., due to process variation) and/or small variation in the clock paths of the clock signals clk1 and clk2. In the example in FIG. 15, closing the shorting switch 1530 in the second mode shorts the clock input 124 of the first sub-DAC 120 and the clock input 134 of the second sub-DAC 130. The controller 1365 may open (i.e., turn off) the shorting switch 1530 in the first mode since the clock signals clk1 and clk2 are 180 degrees out of phase with each other to operate the sub-DACs 120 and 130 in a time-interleaved fashion in the first mode.

In this example, the clock circuit 400 may also include a first bypass switch 1520 and a second bypass switch 1526. The first bypass switch 1520 is coupled between the first input 422 of the first CGC 420 and the output 426 of the first CGC 420. The second bypass switch 1525 is coupled between the first input 432 of the second CGC 430 and the output 436 of the second CGC 430. In this example, the controller 1365 may selectively close (i.e., turn on) the bypass switches 1520 and 1525 to bypass the CGCs 420 and 430. The controller 1365 may disable the CGCs 420 and 430 when the bypass switches 1520 and 1525 are turned on. The controller 1365 opens (i.e., turns off) the bypass switches 1520 and 1525 in the first mode and the second mode discussed above since the CGCs 420 and 430 are used in these modes.

For example, in a third mode, the controller 1365 may close (i.e., turn on) the bypass switches 1520 and 1525 to bypass the CGCs 420 and 430. In this mode, the clock input 124 and 134 of each of the sub-DACs 120 and 130 (shown in FIGS. 13A and 13B) is driven by the input clock signal clk_in. Since the input clock signal clk_in has a frequency of $2F_s$, each of the sub-DACs 120 and 130 performs digital-to-analog conversion at a rate of $2F_s$ in the third mode. In the third mode, the controller 1365 closes (i.e., turns on) the first output switch 1330 and the second output switch 1340, and opens (i.e., turns off) the third output switch 1350 and the fourth output switch 1360. As a result, the output 126 of the first sub-DAC 120 and the output 136 of the second sub-DAC 130 are coupled to the combiner 140, which combines the analog signals from the sub-DACs 120 into a combined analog signal and outputs the combined analog signal at the first output 114-1. In the third mode, the same digital signal may be input to the sub-DACs 120 and 130, in which the sub-DACs 120 and 130 perform digital-to-analog conversion on the digital signal in parallel and in phase with one another at a rate of $2F_s$.

The third mode may provide higher performance compared with time-interleaving at the cost of more power consumption since each sub-DAC 120 and 130 operates at twice the frequency in the third mode. The third mode may be used, for example, for use cases requiring high performance. In the third mode, the controller 1365 may also close the shorting switch 1530 since both sub-DACs 120 and 130 are driven by the input clock signal clk_in in this mode.

In another example, in a fourth mode, the controller 1365 may close (i.e., turn on) the bypass switches 1520 and 1525 to drive the clock input 124 and 134 of each of the sub-DACs 120 and 130 (shown in FIGS. 13A and 13B) with the input clock signal clk_in. Since the input clock signal clk_in has a frequency of $2F_s$, each of the sub-DACs 120 and 130 performs digital-to-analog conversion at a rate of $2F_s$ in the fourth mode. In the fourth mode, the controller 1365 opens the first output switch 1330 and the second output switch 1340, and closes the third output switch 1350 and the fourth output switch 1360. In this mode, a first digital signal may be input to the first input 112-1 and a second digital signal may be input the second input 112-2. The first sub-DAC 120 converts the first digital signal into a first analog signal, and the second sub-DAC 130 converts the second digital signal into a second analog signal. The first analog signal is output from the second output 114-2 and the second analog signal is output from the third output 114-3. Since the clock input 124 and 134 of each of the sub-DACs 120 and 130 is driven by the input clock signal clk_in, each of the sub-DACs 120 and 130 performs digital-to-analog conversion at a rate of $2F_s$ in the fourth mode.

It is to be appreciated that the clock circuit 400 and the DAC circuit 110 are not limited to the exemplary modes discussed above. For example, in some implementations, the clock circuit 400 and the DAC circuit 110 may only use a subset of the modes discussed above and/or may support one or more additional modes not discussed above.

Figure 16:
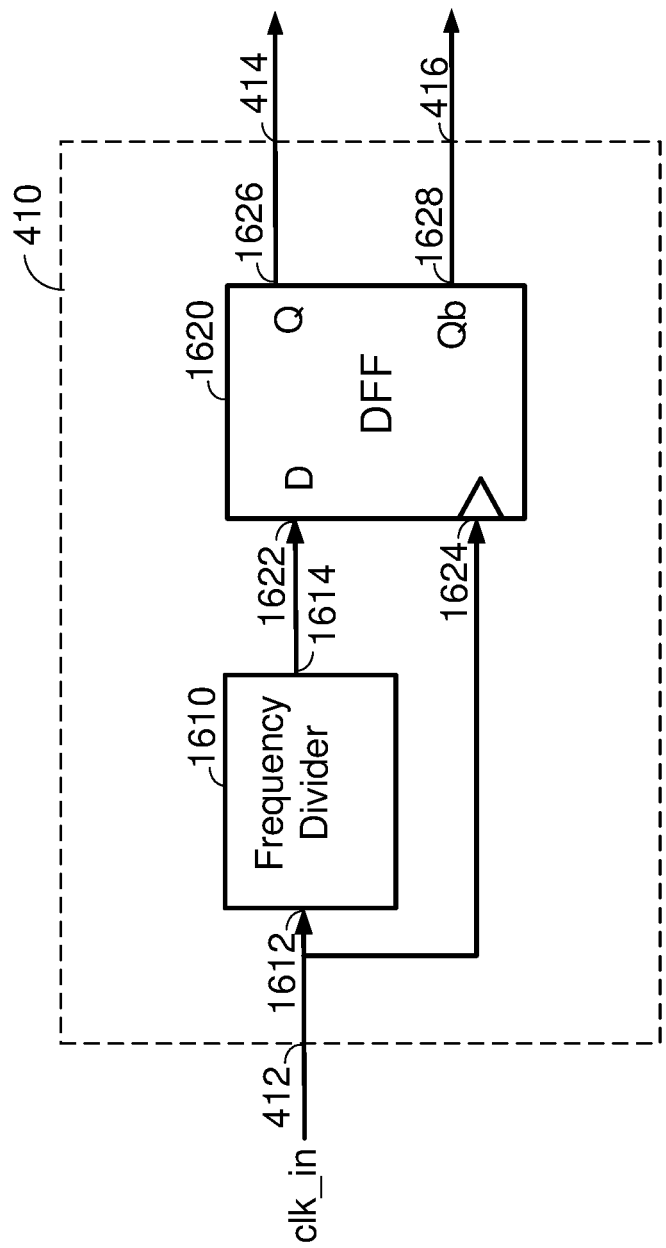
FIG. 16 shows an exemplary implementation of a clock dividing circuit according to certain aspects of the present disclosure.

FIG. 16 shows an exemplary implementation of the clock dividing circuit 410 according to certain aspects of the present disclosure. In this example, the clock dividing circuit 410 includes a frequency divider 1610 and a flop 1620 (e.g., a D flip-flop). The frequency divider 1610 has an input 1612 coupled to the input 412 of the clock dividing circuit 410, and an output 1614. The flop 1620 has a latch input 1622 (labeled "D") coupled to the output 1614 of the frequency divider 1610, a clock input 1624 coupled to the input 412 of the clock dividing circuit 410, a first output 1626 (labeled "Q") coupled to the first output 414 of the clock dividing circuit 410, and a second output 1628 (labeled "Qb") coupled to the second output 416 of the clock dividing circuit 410. The first output 1626 and the second output 1628 may be complementary outputs.

The frequency divider 1610 is configured to receive the input clock signal clk_in, divide the frequency of the input clock signal clk_in (e.g., by two), and output the resulting divided clock signal at the output 1614. The flop 1620 is configured to receive the divided clock signal from the frequency divider 1610 at the latch input 1622 and receive the input clock signal clk_in at the clock input 1624. The flop 1620 is configured to resample the divided clock signal using the input clock signal clk_in. The flop 1620 may do this by latching the logic state of the divided clock signal at the latch input 1622 on each trigger edge of the input clock signal clk_in and outputting the latched logic state at the first output 1626 and the inverse of the latched logic state at the second output 1628. In one example, each trigger edge is a rising edge (also referred to as a positive edge). In another example, each trigger edge is a falling edge (also referred to as a negative edge). Resampling the divided clock signal using the input clock signal clk_in helps synchronize the divided clock signal with the input clock signal clk_in to avoid glitches.

In this example, the resampled divided clock signal at the first output 1626 is used for the first divided clock signal, and the inverse of the resampled divided clock signal at the second output 1628 is used for the second divided clock signal. In this example, the inverse of the resampled divided clock signal corresponds to the resampled divided clock signal shifted by a phase of 180 degrees.

Figure 17:
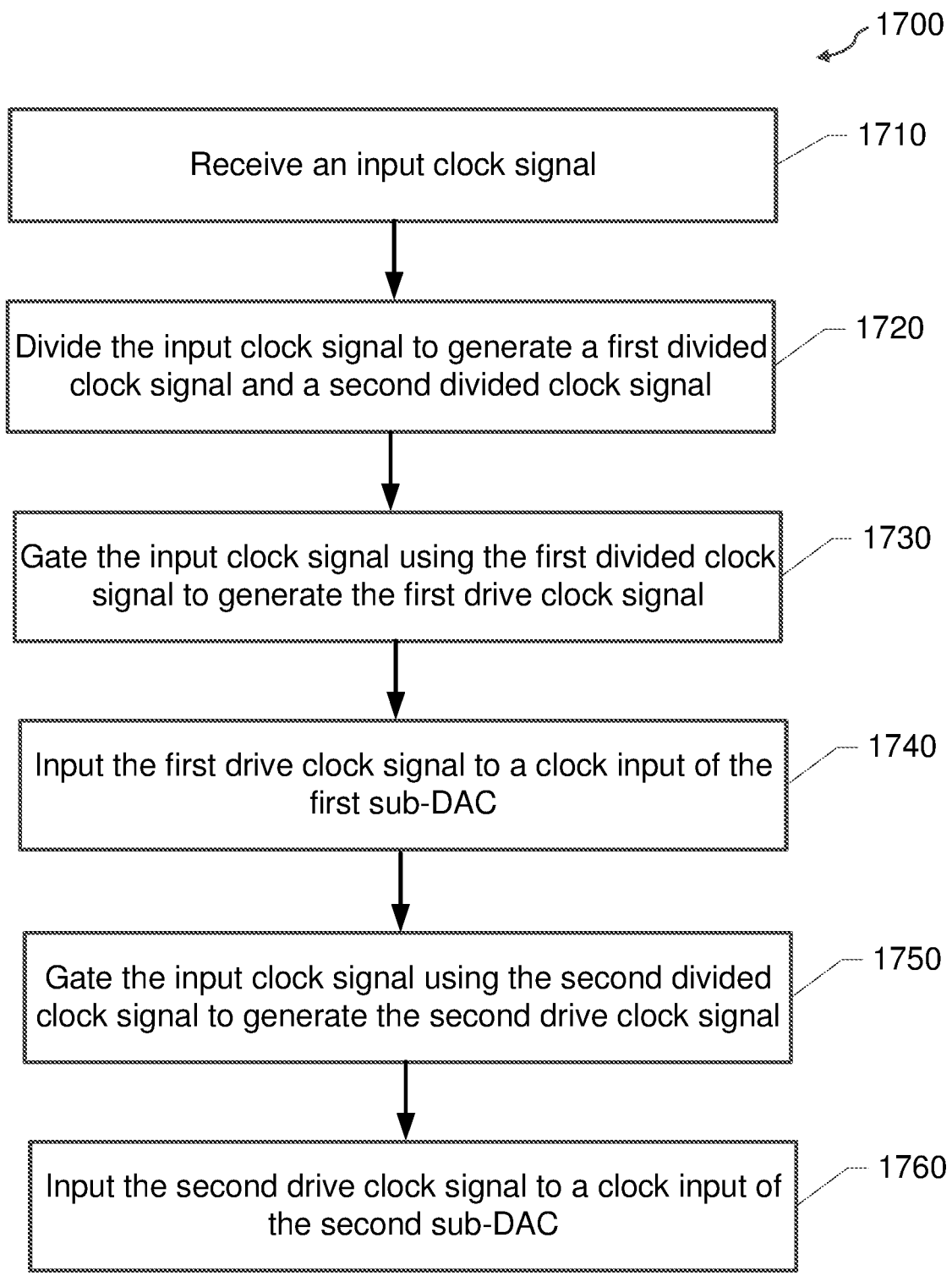
FIG. 17 is a flowchart illustrating an exemplary method of providing a first drive clock signal and a second drive clock signal to a first sub-DAC and a second sub-DAC according to certain aspects of the present disclosure.

FIG. 17 shows an exemplary method 1700 for providing a first drive clock signal and a second drive clock signal to a first sub-digital-to-analog converter (sub-DAC) and a second sub-DAC. The first sub-DAC may correspond to the first sub-DAC 120, and the second sub-DAC may correspond to the second sub-DAC 130.

At block 1710, an input clock signal is received. The input clock signal may correspond to input clock signal clk_in.

At block 1720, the input clock signal is divided to generate a first divided clock signal and a second divided clock signal. For example, the input clock signal may be divided by the clock dividing circuit 410. In certain aspects, the second divided clock signal is phase shifted with respect to the first divided clock signal by approximately 180 degrees. In certain aspects, dividing the input clock signal includes dividing a frequency of the input clock signal (e.g., by two or another divisor) to generate the first divided clock signal and the second divided clock signal.

At block 1730, the input clock signal is gated using the first divided clock signal to generate the first drive clock signal. For example, the input clock signal may be gated using the first divided clock signal by the first clock gating circuit 420. The first drive clock signal may correspond to clock signal clk1.

At block 1740, the first drive clock signal is input to a clock input of the first sub-DAC. For example, the clock input of the first sub-DAC may correspond to clock input 124.

At block 1750, the input clock signal is gated using the second divided clock signal to generate the second drive clock signal. For example, the input clock signal may be gated using the second divided clock signal by the second clock gating circuit 430. The second drive clock signal may correspond to clock signal clk2.

At block 1760, the second drive clock signal is input to a clock input of the second sub-DAC. For example, the clock input of the second sub-DAC may correspond to clock input 134.

In certain aspects, the method 1700 may also include combining an output of the first sub-DAC and an output of the second sub-DAC. For example, the output of the first sub-DAC and the output of the second sub-DAC may be combined by the combiner 140.

It is to be appreciated that the method 1700 is not limited to a particular order of the blocks 1710 to 1760. For example, it is to be appreciated that the blocks 1710 and 1760 may be performed in various orders without departing from the scope of the present disclosure. It is also to be appreciated that two or more of the blocks 1710 and 1760 may be performed concurrently.

Figure 18:
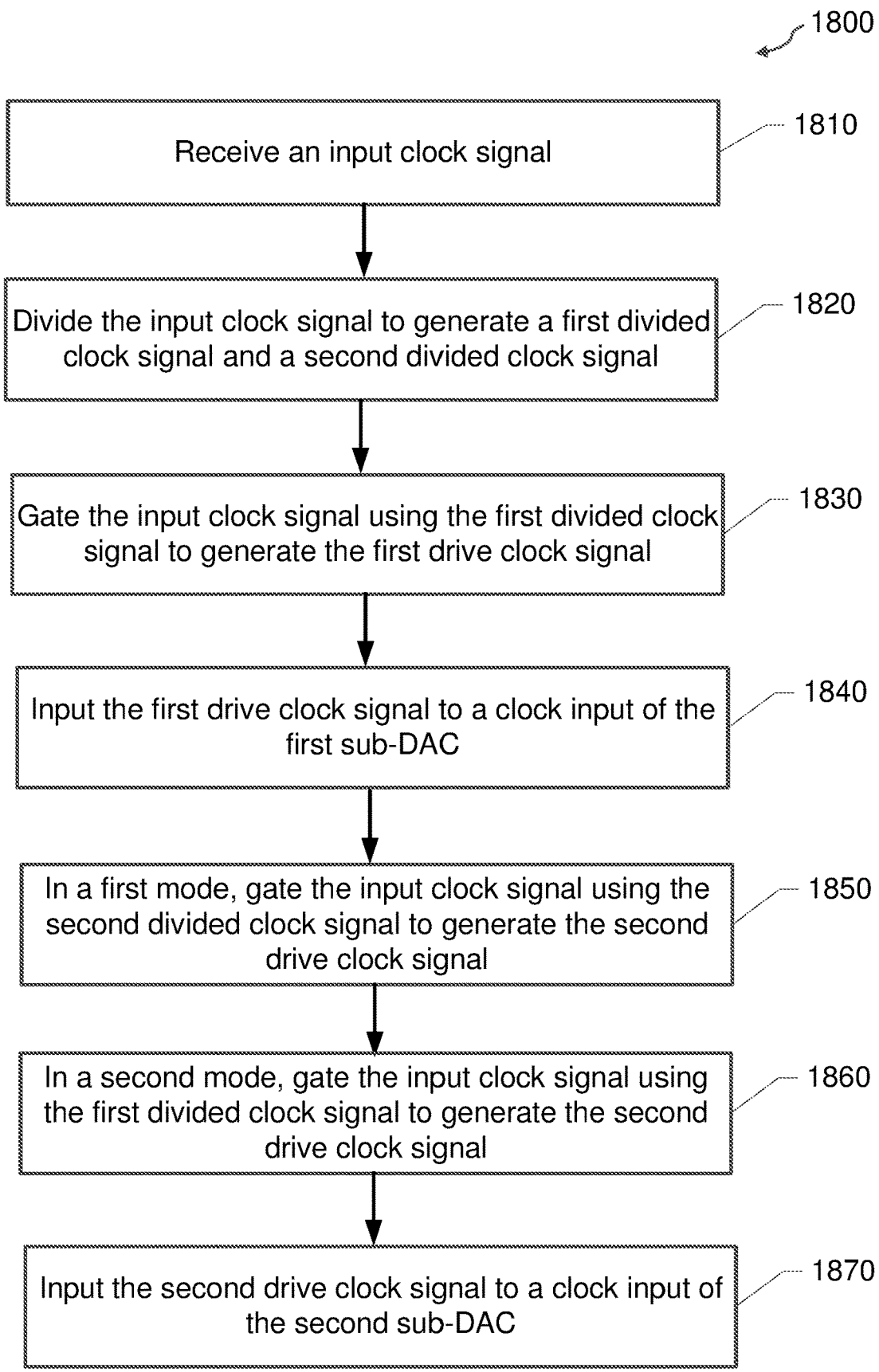
FIG. 18 is a flowchart illustrating another exemplary method of providing a first drive clock signal and a second drive clock signal to a first sub-DAC and a second sub-DAC according to certain aspects of the present disclosure.

FIG. 18 shows an exemplary method 1800 for providing a first drive clock signal and a second drive clock signal to a first sub-digital-to-analog converter (sub-DAC) and a second sub-DAC. The first sub-DAC may correspond to the first sub-DAC 120, and the second sub-DAC may correspond to the second sub-DAC 130.

At block 1810, an input clock signal is received. The input clock signal may correspond to input clock signal clk_in.

At block 1820, the input clock signal is divided to generate a first divided clock signal and a second divided clock signal. For example, the input clock signal may be divided by the clock dividing circuit 410. In certain aspects, the second divided clock signal is phase shifted with respect to the first divided clock signal by approximately 180 degrees. In certain aspects, dividing the input clock signal includes dividing a frequency of the input clock signal (e.g., by two or another divisor) to generate the first divided clock signal and the second divided clock signal.

At block 1830, the input clock signal is gated using the first divided clock signal to generate the first drive clock signal. For example, the input clock signal may be gated using the first divided clock signal by the first clock gating circuit 420. The first drive clock signal may correspond to clock signal clk1.

At block 1840, the first drive clock signal is input to a clock input of the first sub-DAC. For example, the clock input of the first sub-DAC may correspond to clock input 124.

At block 1850, in a first mode, the input clock signal is gated using the second divided clock signal to generate the second drive clock signal. For example, the input clock signal may be gated using the second divided clock signal by the second clock gating circuit 430. The second drive clock signal may correspond to clock signal clk2.

At block 1860, in a second mode, the input clock signal is gated using the first divided clock signal to generate the second drive clock signal. For example, the multiplexer 1310 may select the second input 1314 in the first mode and select the first input 1312 in the second mode.

At block 1870, the second drive clock signal is input to a clock input of the second sub-DAC. For example, the clock input of the second sub-DAC may correspond to clock input 134.

It is to be appreciated that the method 1800 is not limited to a particular order of the blocks 1810 to 1870, and that two or more of the blocks may be performed concurrently.

The method 1800 may also include, in the first mode, combining an output of the first sub-DAC and an output of the second sub-DAC. For example, the output switches 1330 and 1340 may be closed and the output switches 1350 and 1360 may be opened to combine the output 126 of the first sub-DAC 120 and the output 136 of the second sub-DAC 130.

The method 1800 may also include, in the second mode, shorting the clock input of the first sub-DAC and the clock input of the second sub-DAC. For example, the shorting switch 1530 may be closed in the second mode to short the clock input 124 of the first sub-DAC 120 and the clock input 134 of the second sub-DAC 130.

The method 1800 may also include, in the first mode, coupling the output of the first sub-DAC and the output of the second sub-DAC to a first transmitter.

The method 1800 may also include, in the second mode coupling the output of the first sub-DAC to a second transmitter, and coupling the output of the second sub-DAC to a third transmitter. For example, the output switches 1350 and 1360 may be closed to couple the output 126 of the first sub-DAC 120 to the second transmitter 1380 and couple the output 136 of the second sub-DAC 130 to the third transmitter 1390.

Although not explicitly shown, it is to be appreciated to any one or more of the clock paths shown in FIGS. 4, 8, and 10 to 15 may include one or more clock buffers. For example, it is to be appreciated that the clock path between the output 426 of the first CGC 420 and the clock input 124 of the first sub-DAC 120 may include one or more buffers. In this example, the output 426 of the first CGC 420 is coupled to the clock input 124 of the first sub-DAC 120 via the one or more clock buffers. Similarly, the clock path between the output 436 of the second CGC 430 and the clock input 134 of the second sub-DAC 130 may include one or more buffers. In this example, the output 436 of the second CGC 430 is coupled to the clock input 134 of the second sub-DAC 130 via the one or more clock buffers. Also, the clock paths between each of the PLLs 1420 and 1430 and the clock circuit 400 may include one or more clock buffers.

Implementation examples are described in the following numbered clauses:

1. A system, comprising:
   a clock dividing circuit having an input, a first output, and a second output, wherein the input of the clock dividing circuit is configured to receive an input clock signal;
   a first clock gating circuit having a first input, a second input, and an output, wherein the first input of the first clock gating circuit is configured to receive the input clock signal, and the second input of the first clock gating circuit is coupled to the first output of the clock dividing circuit;
   a second clock gating circuit having a first input, a second input, and an output, wherein the first input of the second clock gating circuit is configured to receive the input clock signal, and the second input of the second clock gating circuit is coupled to the second output of the clock dividing circuit;
   a first sub-digital-to-analog converter (sub-DAC) having a clock input coupled to the output of the first clock gating circuit; and
   a second sub-DAC having a clock input coupled to the output of the second clock gating circuit.

2. The system of clause 1, wherein the clock dividing circuit is configured to:
   divide the input clock signal to generate a first divided clock signal and a second divided clock signal;
   output the first divided clock signal at the first output of the clock dividing circuit; and
   output the second divided clock signal at the second output of the clock dividing circuit.

3. The system of clause 2, wherein the second divided clock signal is phase shifted with respect to the first divided clock signal by approximately 180 degrees.

4. The system of clause 3, wherein the clock dividing circuit is configured to invert the first divided clock signal to generate the second divided clock signal.

5. The system of any one of clauses 2 to 4, wherein the clock dividing circuit is configured to divide a frequency of the input clock signal to generate the first divided clock signal and the second divided clock signal.

6. The system of clause 5, wherein the frequency of the input clock signal is divided by two.

7. The system of any one of clauses 2 to 6, wherein the first clock gating circuit is configured to:
gate the input clock signal using the first divided clock signal to generate a first drive clock signal; and
output the first drive clock signal at the output of the first clock gating circuit.

8. The system of clause 7, wherein the first clock gating circuit includes a delay circuit having a time delay, and the first clock gating circuit is configured to control a pulse width of the first drive clock signal based on the time delay.

9. The system of clause 7 or 8, wherein the second clock gating circuit is configured to:
gate the input clock signal using the second divided clock signal to generate a second drive clock signal; and
output the second drive clock signal at the output of the second clock gating circuit.

10. The system of clause 9, wherein the second divided clock signal is phase shifted with respect to the first divided clock signal by approximately 180 degrees.

11. The system of clause 9 or 10, wherein:
the first clock gating circuit is configured to gate even pulses of the input clock signal using the first divided clock signal to generate the first drive clock signal; and
the second clock gating circuit is configured to gate odd pulses of the input clock signal using the second divided clock signal to generate the second drive clock signal.

12. The system of clause 9 or 10, wherein:
the first clock gating circuit is configured to gate odd pulses of the input clock signal using the first divided clock signal to generate the first drive clock signal; and
the second clock gating circuit is configured to gate even pulses of the input clock signal using the second divided clock signal to generate the second drive clock signal.

13. The system of any one of clauses 1 to 12, further comprising a combiner coupled to an output of the first sub-DAC and an output of the second sub-DAC.

14. The system of clause 13, wherein the combiner is coupled to a transmitter.

15. A system, comprising:
a clock dividing circuit having an input, a first output, and a second output, wherein the input of the clock dividing circuit is configured to receive an input clock signal;
a first clock gating circuit having a first input, a second input, and an output, wherein the first input of the first clock gating circuit is configured to receive the input clock signal, and the second input of the first clock gating circuit is coupled to the first output of the clock dividing circuit;
a multiplexer having a first input, a second input, and an output, wherein the first input of the multiplexer is coupled to the first output of the clock dividing circuit, and the second input of the multiplexer is coupled to the second output of the clock dividing circuit;
a second clock gating circuit having a first input, a second input, and an output, wherein the first input of the second clock gating circuit is configured to receive the input clock signal, and the second input of the second clock gating circuit is coupled to the output of the multiplexer;
a first sub-digital-to-analog converter (sub-DAC) having a clock input coupled to the output of the first clock gating circuit; and
a second sub-DAC having a clock input coupled to the output of the second clock gating circuit.

16. The system of clause 15, wherein the clock dividing circuit is configured to:
divide the input clock signal to generate a first divided clock signal and a second divided clock signal;
output the first divided clock signal at the first output of the clock dividing circuit; and
output the second divided clock signal at the second output of the clock dividing circuit.

17. The system of clause 16, wherein the clock dividing circuit is configured to divide a frequency of the input clock signal to generate the first divided clock signal and the second divided clock signal.

18. The system of clause 17, wherein the frequency of the input clock signal is divided by two.

19. The system of any one of clauses 16 to 18, wherein the second divided clock signal is phase shifted with respect to the first divided clock signal by approximately 180 degrees.

20. The system of clause 19, wherein the clock dividing circuit is configured to invert the first divided clock signal to generate the second divided clock signal.

21. The system of any one of clauses 16 to 20, further comprising a controller configured to:
cause the multiplexer to select the second input of the multiplexer in a first mode; and
cause the multiplexer to select the first input of the multiplexer in a second mode.

22. The system of clause 21, further comprising:
a first output switch coupled between an output of the first sub-DAC and a combiner; and
a second output switch coupled between an output of the second sub-DAC and the combiner;
wherein the controller is configured to:
close the first output switch and the second output switch in the first mode, and
open the first output switch and the second output switch in the second mode.

23. The system of clause 22, further comprising a shorting switch coupled between the output of the first clock gating circuit and the output of the second clock gating circuit, wherein the controller is configured to open the shorting switch in the first mode and close the shorting switching in the second mode.

24. The system of clause 22 or 23, wherein an output of the combiner is coupled to a first DAC output, and the system further comprises:
a third output switch coupled between the output of the first sub-DAC and a second DAC output; and
a fourth output switch coupled between the output of the second sub-DAC and a third DAC output;
wherein the controller is configured to:
open the third output switch and the fourth output switch in the first mode, and
close the third output switch and the fourth output switch in the second mode.

25. The system of any one of clauses 21 to 24, further comprising:
a first bypass switch coupled between the first input of the first clock gating circuit and the output of the first clock gating circuit; and
a second bypass switch coupled between the first input of the second clock gating circuit and the output of the second clock gating circuit;
wherein the controller is configured to:
open the first bypass switch and the second bypass switch in the first mode and the second mode; and close the first bypass switch and the second bypass switch in a third mode.

26. A method for providing a first drive clock signal and a second drive clock signal to a first sub-digital-to-analog converter (sub-DAC) and a second sub-DAC comprising:

receiving an input clock signal;

dividing the input clock signal to generate a first divided clock signal and a second divided clock signal;

gating the input clock signal using the first divided clock signal to generate the first drive clock signal;

inputting the first drive clock signal to a clock input of the first sub-DAC;

gating the input clock signal using the second divided clock signal to generate the second drive clock signal; and inputting the second drive clock signal to a clock input of the second sub-DAC.

27. The method of clause 26, wherein the second divided clock signal is phase shifted with respect to the first divided clock signal by approximately 180 degrees.

28. The method of clause 26 or 27, wherein:

gating the input clock signal using the first divided clock signal comprises gating even pulses of the input clock signal using the first divided clock signal; and gating the input clock signal using the second divided clock signal comprises gating odd pulses of the input clock signal using the second divided clock signal.

29. The method of clause 26 or 27, wherein:

gating the input clock signal using the first divided clock signal comprises gating odd pulses of the input clock signal using the first divided clock signal; and gating the input clock signal using the second divided clock signal comprises gating even pulses of the input clock signal using the second divided clock signal.

30. The method of any one of clauses 26 to 29, wherein dividing the input clock signal to generate the first divided clock signal and the second divided clock signal comprises dividing a frequency of the input clock signal to generate the first divided clock signal and the second divided clock signal.

31. The method of clause 30, wherein dividing the frequency of the input clock signal comprises dividing the frequency of the input clock signal by two.

32. The method of any one of clauses 26 to 31, further comprising combining an output of the first sub-DAC and an output of the second sub-DAC.

33. A method for providing a first drive clock signal and a second drive clock signal to a first sub-digital-to-analog converter (sub-DAC) and a second sub-DAC comprising:

receiving an input clock signal;

dividing the input clock signal to generate a first divided clock signal and a second divided clock signal;

gating the input clock signal using the first divided clock signal to generate the first drive clock signal;

inputting the first drive clock signal to a clock input of the first sub-DAC;

in a first mode, gating the input clock signal using the second divided clock signal to generate the second drive clock signal;

in a second mode, gating the input clock signal using the first divided clock signal to generate the second drive clock signal;

inputting the second drive clock signal to a clock input of the second sub-DAC.

34. The method of clause 33, wherein the second divided clock signal is phase shifted with respect to the first divided clock signal by approximately 180 degrees.

35. The method of clause 33 or 34, wherein:

gating the input clock signal using the first divided clock signal comprises gating even pulses of the input clock signal using the first divided clock signal; and gating the input clock signal using the second divided clock signal comprises gating odd pulses of the input clock signal using the second divided clock signal.

36. The method of clause 33 or 34, wherein:

gating the input clock signal using the first divided clock signal comprises gating odd pulses of the input clock signal using the first divided clock signal; and gating the input clock signal using the second divided clock signal comprises gating even pulses of the input clock signal using the second divided clock signal.

37. The method of any one of clauses 33 to 36, wherein dividing the input clock signal to generate the first divided clock signal and the second divided clock signal comprises dividing a frequency of the input clock signal to generate the first divided clock signal and the second divided clock signal.

38. The method of clause 37, wherein dividing the frequency of the input clock signal comprises dividing the frequency of the input clock signal by two.

39. The method of any one of clauses 33 to 38, further comprising, in the first mode, combining an output of the first sub-DAC and an output of the second sub-DAC.

40. The method of clause 39, further comprising, in the second mode, shorting the clock input of the first sub-DAC and the clock input of the second sub-DAC.

41. The method of clause 39 or 40, further comprising, in the first mode, coupling the output of the first sub-DAC and the output of the second sub-DAC to a first transmitter.

42. The method of clause 41, further comprising, in the second mode:

coupling the output of the first sub-DAC to a second transmitter; and coupling the output of the second sub-DAC to a third transmitter.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
    a clock dividing circuit having an input, a first output, and a second output, wherein the input of the clock dividing circuit is configured to receive an input clock signal;
    a first clock gating circuit having a first input, a second input, and an output, wherein the first input of the first clock gating circuit is configured to receive the input clock signal, and the second input of the first clock gating circuit is coupled to the first output of the clock dividing circuit;
    a second clock gating circuit having a first input, a second input, and an output, wherein the first input of the second clock gating circuit is configured to receive the input clock signal, and the second input of the second clock gating circuit is coupled to the second output of the clock dividing circuit;
    a first sub-digital-to-analog converter (sub-DAC) having a clock input coupled to the output of the first clock gating circuit; and
    a second sub-DAC having a clock input coupled to the output of the second clock gating circuit.

2. The system of claim 1, wherein the clock dividing circuit is configured to:
    divide the input clock signal to generate a first divided clock signal and a second divided clock signal;
    output the first divided clock signal at the first output of the clock dividing circuit; and
    output the second divided clock signal at the second output of the clock dividing circuit.

3. The system of claim 2, wherein the second divided clock signal is phase shifted with respect to the first divided clock signal by approximately 180 degrees.

4. The system of claim 3, wherein the clock dividing circuit is configured to invert the first divided clock signal to generate the second divided clock signal.

5. The system of claim 2, wherein the clock dividing circuit is configured to divide a frequency of the input clock signal to generate the first divided clock signal and the second divided clock signal.

6. The system of claim 5, wherein the frequency of the input clock signal is divided by two.

7. The system of claim 2, wherein the first clock gating circuit is configured to:
    gate the input clock signal using the first divided clock signal to generate a first drive clock signal; and
    output the first drive clock signal at the output of the first clock gating circuit.

8. The system of claim 7, wherein the first clock gating circuit includes a delay circuit having a time delay, and the first clock gating circuit is configured to control a pulse width of the first drive clock signal based on the time delay.

9. The system of claim 7, wherein the second clock gating circuit is configured to:
    gate the input clock signal using the second divided clock signal to generate a second drive clock signal; and
    output the second drive clock signal at the output of the second clock gating circuit.

10. The system of claim 9, wherein the second divided clock signal is phase shifted with respect to the first divided clock signal by approximately 180 degrees.

11. The system of claim 9, wherein:
    the first clock gating circuit is configured to gate even pulses of the input clock signal using the first divided clock signal to generate the first drive clock signal; and
    the second clock gating circuit is configured to gate odd pulses of the input clock signal using the second divided clock signal to generate the second drive clock signal.

12. The system of claim 9, wherein:
    the first clock gating circuit is configured to gate odd pulses of the input clock signal using the first divided clock signal to generate the first drive clock signal; and
    the second clock gating circuit is configured to gate even pulses of the input clock signal using the second divided clock signal to generate the second drive clock signal.

13. The system of claim 1, further comprising a combiner coupled to an output of the first sub-DAC and an output of the second sub-DAC.

14. The system of claim 13, wherein the combiner is coupled to a transmitter.

15. A system, comprising:
    a clock dividing circuit having an input, a first output, and a second output, wherein the input of the clock dividing circuit is configured to receive an input clock signal;
    a first clock gating circuit having a first input, a second input, and an output, wherein the first input of the first clock gating circuit is configured to receive the input clock signal, and the second input of the first clock gating circuit is coupled to the first output of the clock dividing circuit;
    a multiplexer having a first input, a second input, and an output, wherein the first input of the multiplexer is coupled to the first output of the clock dividing circuit, and the second input of the multiplexer is coupled to the second output of the clock dividing circuit;
    a second clock gating circuit having a first input, a second input, and an output, wherein the first input of the second clock gating circuit is configured to receive the input clock signal, and the second input of the second clock gating circuit is coupled to the output of the multiplexer;
    a first sub-digital-to-analog converter (sub-DAC) having a clock input coupled to the output of the first clock gating circuit; and
    a second sub-DAC having a clock input coupled to the output of the second clock gating circuit.

16. The system of claim 15, wherein the clock dividing circuit is configured to:
    divide the input clock signal to generate a first divided clock signal and a second divided clock signal;
    output the first divided clock signal at the first output of the clock dividing circuit; and
    output the second divided clock signal at the second output of the clock dividing circuit.

17. The system of claim 16, wherein the clock dividing circuit is configured to divide a frequency of the input clock signal to generate the first divided clock signal and the second divided clock signal.

18. The system of claim 17, wherein the frequency of the input clock signal is divided by two.

19. The system of claim 16, wherein the second divided clock signal is phase shifted with respect to the first divided clock signal by approximately 180 degrees.

20. The system of claim 19, wherein the clock dividing circuit is configured to invert the first divided clock signal to generate the second divided clock signal.

21. The system of claim 16, further comprising a controller configured to:
    cause the multiplexer to select the second input of the multiplexer in a first mode; and cause the multiplexer to select the first input of the multiplexer in a second mode.

22. The system of claim 21, further comprising:
a first output switch coupled between an output of the first sub-DAC and a combiner; and
a second output switch coupled between an output of the second sub-DAC and the combiner;
wherein the controller is configured to:
close the first output switch and the second output switch in the first mode, and
open the first output switch and the second output switch in the second mode.

23. The system of claim 22, further comprising a shorting switch coupled between the output of the first clock gating circuit and the output of the second clock gating circuit, wherein the controller is configured to open the shorting switch in the first mode and close the shorting switching in the second mode.

24. The system of claim 22, wherein an output of the combiner is coupled to a first DAC output, and the system further comprises:
a third output switch coupled between the output of the first sub-DAC and a second DAC output; and
a fourth output switch coupled between the output of the second sub-DAC and a third DAC output;
wherein the controller is configured to:
open the third output switch and the fourth output switch in the first mode, and
close the third output switch and the fourth output switch in the second mode.

25. The system of claim 21, further comprising:
a first bypass switch coupled between the first input of the first clock gating circuit and the output of the first clock gating circuit; and
a second bypass switch coupled between the first input of the second clock gating circuit and the output of the second clock gating circuit;
wherein the controller is configured to:
open the first bypass switch and the second bypass switch in the first mode and the second mode; and
close the first bypass switch and the second bypass switch in a third mode.

26. A method for providing a first drive clock signal and a second drive clock signal to a first sub-digital-to-analog converter (sub-DAC) and a second sub-DAC comprising:
receiving an input clock signal;
dividing the input clock signal to generate a first divided clock signal and a second divided clock signal;
gating the input clock signal using the first divided clock signal to generate the first drive clock signal;
inputting the first drive clock signal to a clock input of the first sub-DAC;
gating the input clock signal using the second divided clock signal to generate the second drive clock signal; and
inputting the second drive clock signal to a clock input of the second sub-DAC.

27. The method of claim 26, wherein the second divided clock signal is phase shifted with respect to the first divided clock signal by approximately 180 degrees.

28. The method of claim 26, wherein:
gating the input clock signal using the first divided clock signal comprises gating even pulses of the input clock signal using the first divided clock signal; and
gating the input clock signal using the second divided clock signal comprises gating odd pulses of the input clock signal using the second divided clock signal.

29. The method of claim 26, wherein:
gating the input clock signal using the first divided clock signal comprises gating odd pulses of the input clock signal using the first divided clock signal; and
gating the input clock signal using the second divided clock signal comprises gating even pulses of the input clock signal using the second divided clock signal.

30. The method of claim 26, wherein dividing the input clock signal to generate the first divided clock signal and the second divided clock signal comprises dividing a frequency of the input clock signal to generate the first divided clock signal and the second divided clock signal.

31. The method of claim 30, wherein dividing the frequency of the input clock signal comprises dividing the frequency of the input clock signal by two.

32. The method of claim 26, further comprising combining an output of the first sub-DAC and an output of the second sub-DAC.

* * * * *